United States Patent
Crisp et al.

(10) Patent No.: US 9,460,758 B2
(45) Date of Patent: Oct. 4, 2016

(54) SINGLE PACKAGE DUAL CHANNEL MEMORY WITH CO-SUPPORT

(71) Applicant: Invensas Corporation, San Jose, CA (US)

(72) Inventors: Richard Dewitt Crisp, Hornitos, CA (US); Yong Chen, Palo Alto, CA (US); Belgacem Haba, Saratoga, CA (US); Wael Zohni, San Jose, CA (US); Zhuowen Sun, Campbell, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/753,607

(22) Filed: Jun. 29, 2015

(65) Prior Publication Data

US 2015/0302901 A1 Oct. 22, 2015

Related U.S. Application Data

(63) Continuation of application No. 14/075,020, filed on Nov. 8, 2013, now Pat. No. 9,070,423.

(60) Provisional application No. 61/833,900, filed on Jun. 11, 2013.

(51) Int. Cl.
*G11C 5/00* (2006.01)
*G11C 5/02* (2006.01)
(Continued)

(52) U.S. Cl.
CPC ............. *G11C 5/025* (2013.01); *G11C 5/04* (2013.01); *G11C 5/063* (2013.01); *G11C 8/12* (2013.01);
(Continued)

(58) Field of Classification Search
USPC ......... 365/51, 52, 63, 230.03, 233.1, 233.11, 365/233.12, 233.13
See application file for complete search history.

(56) References Cited

U.S. PATENT DOCUMENTS 3,670,208 A 6/1972 Hovnanian et al.
4,747,081 A 5/1988 Heilveil et al.
(Continued)

FOREIGN PATENT DOCUMENTS

EP 1205977 A2 5/2002
JP 61-093694 5/1986
(Continued)

OTHER PUBLICATIONS

Kang, et al., 8GB 3D DDR3 DRAM Using Through-Silicon-Via Technology, IEEE, International Solid-State Circuits Conference, 2009, Samsung Electronics, Hwasung, Korea.
(Continued)

*Primary Examiner* — Trong Phan
(74) *Attorney, Agent, or Firm* — Lerner, David, Littenberg, Krumholz & Mentlik, LLP

(57) ABSTRACT

A microelectronic package can include a support element having first and second surfaces and substrate contacts at the first or second surface, zeroth and first stacked microelectronic elements electrically coupled with the substrate contacts, and terminals at the second surface electrically coupled with the microelectronic elements. The second surface can have a southwest region encompassing entire lengths of south and west edges of the second surface and extending in orthogonal directions from the south and west edges one-third of each distance toward north and east edges of the second surface, respectively. The terminals can include first terminals at a southwest region of the second surface, the first terminals configured to carry address information usable by circuitry within the microelectronic package to determine an addressable memory location from among all the available addressable memory locations of the memory storage arrays of at least one of the zeroth or first microelectronic elements.

20 Claims, 3 Drawing Sheets

(51) Int. Cl.
*G11C 5/06* (2006.01)
*G11C 8/00* (2006.01)
*G11C 8/16* (2006.01)
*G11C 8/18* (2006.01)
*H01L 23/00* (2006.01)
*H01L 25/065* (2006.01)
*G11C 5/04* (2006.01)
*G11C 8/12* (2006.01)
*G11C 11/408* (2006.01)
*H01L 23/538* (2006.01)
*H01L 25/10* (2006.01)

(52) U.S. Cl.
CPC .............. *G11C 11/408* (2013.01); *H01L 24/00* (2013.01); *H01L 25/0657* (2013.01); *H01L 23/5386* (2013.01); *H01L 23/5389* (2013.01); *H01L 24/73* (2013.01); *H01L 25/105* (2013.01); *H01L 2224/04042* (2013.01); *H01L 2224/05624* (2013.01); *H01L 2224/05647* (2013.01); *H01L 2224/32145* (2013.01); *H01L 2224/32225* (2013.01); *H01L 2224/48091* (2013.01); *H01L 2224/48227* (2013.01); *H01L 2224/49175* (2013.01); *H01L 2224/73265* (2013.01); *H01L 2225/0651* (2013.01); *H01L 2225/06562* (2013.01); *H01L 2225/1023* (2013.01); *H01L 2225/1052* (2013.01); *H01L 2225/1058* (2013.01); *H01L 2924/10253* (2013.01); *H01L 2924/10329* (2013.01); *H01L 2924/1436* (2013.01); *H01L 2924/15192* (2013.01); *H01L 2924/15311* (2013.01); *H01L 2924/181* (2013.01)

(56) References Cited

U.S. PATENT DOCUMENTS

| | | |
|---|---|---|
| 5,148,265 A | 9/1992 | Khandros et al. |
| 5,148,266 A | 9/1992 | Khandros et al. |
| 5,163,024 A | 11/1992 | Heilveil et al. |
| 5,210,639 A | 5/1993 | Redwine et al. |
| 5,480,840 A | 1/1996 | Barnes et al. |
| 5,679,977 A | 10/1997 | Khandros et al. |
| 5,691,570 A | 11/1997 | Kozuka |
| 5,751,553 A | 5/1998 | Clayton |
| 5,777,391 A | 7/1998 | Nakamura et al. |
| 5,821,614 A | 10/1998 | Hashimoto et al. |
| 5,899,705 A | 5/1999 | Akram |
| 5,929,517 A | 7/1999 | Distefano et al. |
| 5,936,305 A | 8/1999 | Akram |
| 5,949,700 A * | 9/1999 | Furukawa ......... H01L 27/10841 365/51 |
| 5,973,403 A | 10/1999 | Wark |
| 6,086,386 A | 7/2000 | Fjelstad et al. |
| 6,130,116 A | 10/2000 | Smith et al. |
| 6,159,837 A | 12/2000 | Yamaji et al. |
| 6,177,636 B1 | 1/2001 | Fjelstad |
| 6,197,665 B1 | 3/2001 | DiStefano et al. |
| 6,252,264 B1 | 6/2001 | Bailey et al. |
| 6,255,899 B1 | 7/2001 | Bertin et al. |
| 6,261,867 B1 | 7/2001 | Robichaud et al. |
| 6,297,960 B1 | 10/2001 | Moden et al. |
| 6,313,532 B1 | 11/2001 | Shimoishizaka et al. |
| 6,323,436 B1 | 11/2001 | Hedrick et al. |
| 6,343,019 B1 | 1/2002 | Jiang et al. |
| 6,376,769 B1 | 4/2002 | Chung |
| 6,380,318 B1 | 4/2002 | Saito et al. |
| 6,384,473 B1 | 5/2002 | Peterson et al. |
| 6,426,560 B1 | 7/2002 | Kawamura et al. |
| 6,433,422 B1 | 8/2002 | Yamasaki |
| 6,445,594 B1 | 9/2002 | Nakagawa et al. |
| 6,452,266 B1 | 9/2002 | Iwaya et al. |
| 6,461,895 B1 | 10/2002 | Liang et al. |
| 6,462,423 B1 | 10/2002 | Akram et al. |
| 6,521,981 B2 | 2/2003 | Miyazaki et al. |
| 6,560,134 B2 | 5/2003 | Brox et al. |
| 6,577,004 B1 | 6/2003 | Rumsey et al. |
| 6,611,057 B2 | 8/2003 | Mikubo et al. |
| 6,617,695 B1 | 9/2003 | Kasatani |
| 6,619,973 B2 | 9/2003 | Perino et al. |
| 6,620,648 B2 | 9/2003 | Yang |
| 6,633,078 B2 | 10/2003 | Hamaguchi et al. |
| 6,658,530 B1 | 12/2003 | Robertson et al. |
| 6,661,089 B2 | 12/2003 | Huang |
| 6,692,987 B2 | 2/2004 | Lim et al. |
| 6,707,141 B2 | 3/2004 | Akram |
| 6,720,666 B2 | 4/2004 | Lim et al. |
| 6,742,098 B1 | 5/2004 | Halbert et al. |
| 6,744,137 B2 | 6/2004 | Kinsman |
| 6,765,288 B2 | 7/2004 | Damberg |
| 6,781,220 B2 | 8/2004 | Taube et al. |
| 6,821,815 B2 | 11/2004 | Smith et al. |
| 6,836,007 B2 | 12/2004 | Michii et al. |
| 6,876,088 B2 | 4/2005 | Harvey |
| 6,894,379 B2 | 5/2005 | Feurle |
| 6,894,381 B2 | 5/2005 | Hetzel et al. |
| 6,906,415 B2 | 6/2005 | Jiang et al. |
| 6,943,057 B1 | 9/2005 | Shim et al. |
| 6,977,440 B2 | 12/2005 | Pflughaupt et al. |
| 6,982,485 B1 | 1/2006 | Lee et al. |
| 7,061,092 B2 | 6/2006 | Akram et al. |
| 7,061,105 B2 | 6/2006 | Masuda et al. |
| 7,061,121 B2 | 6/2006 | Haba |
| 7,091,064 B2 | 8/2006 | Jiang |
| 7,122,897 B2 | 10/2006 | Aiba et al. |
| 7,123,497 B2 | 10/2006 | Matsui et al. |
| 7,138,709 B2 | 11/2006 | Kumamoto |
| 7,141,879 B2 | 11/2006 | Wakamiya et al. |
| 7,145,226 B2 | 12/2006 | Kumamoto |
| 7,151,319 B2 | 12/2006 | Iida et al. |
| 7,164,149 B2 | 1/2007 | Matsubara |
| 7,170,158 B2 | 1/2007 | Choi et al. |
| 7,262,507 B2 | 8/2007 | Hino et al. |
| 7,272,888 B2 | 9/2007 | DiStefano |
| 7,294,928 B2 | 11/2007 | Bang et al. |
| 7,324,352 B2 | 1/2008 | Goodwin |
| 7,368,319 B2 | 5/2008 | Ha et al. |
| 7,372,169 B2 | 5/2008 | Chang |
| 7,389,937 B2 | 6/2008 | Ito |
| 7,405,471 B2 | 7/2008 | Kledzik et al. |
| 7,414,312 B2 | 8/2008 | Nguyen et al. |
| 7,420,284 B2 | 9/2008 | Miyazaki et al. |
| 7,476,975 B2 | 1/2009 | Ogata |
| 7,518,226 B2 | 4/2009 | Cablao et al. |
| 7,535,110 B2 | 5/2009 | Wu et al. |
| 7,550,842 B2 | 6/2009 | Khandros et al. |
| 7,589,409 B2 | 9/2009 | Gibson et al. |
| 7,633,146 B2 | 12/2009 | Masuda et al. |
| 7,633,147 B2 | 12/2009 | Funaba et al. |
| 7,642,635 B2 | 1/2010 | Kikuchi et al. |
| 7,692,931 B2 | 4/2010 | Chong et al. |
| 7,763,964 B2 | 7/2010 | Matsushima |
| 7,763,969 B2 | 7/2010 | Zeng et al. |
| RE41,478 E | 8/2010 | Nakamura et al. |
| RE41,721 E | 9/2010 | Nakamura et al. |
| RE41,722 E | 9/2010 | Nakamura et al. |
| 7,795,721 B2 | 9/2010 | Kurita |
| RE41,972 E | 11/2010 | Lenander et al. |
| 7,855,445 B2 | 12/2010 | Landry et al. |
| 7,989,940 B2 | 8/2011 | Haba et al. |
| RE42,972 E | 11/2011 | Nakamura et al. |
| 8,072,037 B2 | 12/2011 | Murphy et al. |
| 8,138,015 B2 | 3/2012 | Joseph et al. |
| 8,254,155 B1 | 8/2012 | Crisp et al. |
| 8,278,764 B1 | 10/2012 | Crisp et al. |
| 8,338,963 B2 | 12/2012 | Haba et al. |
| 8,345,441 B1 | 1/2013 | Crisp et al. |
| 8,378,478 B2 | 2/2013 | Desai et al. |
| 8,405,207 B1 | 3/2013 | Crisp et al. |
| 8,426,983 B2 | 4/2013 | Takeda et al. |
| 8,432,046 B2 | 4/2013 | Miyata et al. |
| 8,436,457 B2 | 5/2013 | Crisp et al. |

(56) References Cited

U.S. PATENT DOCUMENTS

| | | |
|---|---|---|
| 8,436,477 B2 | 5/2013 | Crisp et al. |
| 8,441,111 B2 | 5/2013 | Crisp et al. |
| 8,502,390 B2 | 8/2013 | Crisp et al. |
| 8,513,813 B2 | 8/2013 | Crisp et al. |
| 8,513,817 B2 | 8/2013 | Haba et al. |
| 8,525,327 B2 | 9/2013 | Crisp et al. |
| 8,610,260 B2 | 12/2013 | Crisp et al. |
| 8,629,545 B2 | 1/2014 | Crisp et al. |
| 8,653,646 B2 | 2/2014 | Crisp et al. |
| 8,659,139 B2 | 2/2014 | Crisp et al. |
| 8,659,140 B2 | 2/2014 | Crisp et al. |
| 8,659,141 B2 | 2/2014 | Crisp et al. |
| 8,659,142 B2 | 2/2014 | Crisp et al. |
| 8,659,143 B2 | 2/2014 | Crisp et al. |
| 8,670,261 B2 | 3/2014 | Crisp et al. |
| 8,823,165 B2 | 9/2014 | Haba et al. |
| 8,902,680 B2 * | 12/2014 | Yamamoto ............ G11C 7/1051 365/51 |
| 8,917,532 B2 * | 12/2014 | Crisp ...................... G11C 5/04 365/63 |
| 8,981,547 B2 | 3/2015 | Crisp et al. |
| 2001/0002727 A1 | 6/2001 | Shiraishi et al. |
| 2001/0013662 A1 | 8/2001 | Kudou et al. |
| 2001/0022740 A1 | 9/2001 | Nuxoll et al. |
| 2001/0038106 A1 | 11/2001 | Coteus et al. |
| 2002/0000583 A1 | 1/2002 | Kitsukawa et al. |
| 2002/0016056 A1 | 2/2002 | Corisis |
| 2002/0027019 A1 | 3/2002 | Hashimoto |
| 2002/0030261 A1 | 3/2002 | Rolda, Jr. et al. |
| 2002/0043719 A1 | 4/2002 | Iwaya et al. |
| 2002/0053727 A1 | 5/2002 | Kimura |
| 2002/0053732 A1 | 5/2002 | Iwaya et al. |
| 2002/0066950 A1 | 6/2002 | Joshi |
| 2002/0105096 A1 | 8/2002 | Hirata et al. |
| 2002/0130412 A1 | 9/2002 | Nagai et al. |
| 2002/0171142 A1 | 11/2002 | Kinsman |
| 2003/0064547 A1 | 4/2003 | Akram et al. |
| 2003/0089978 A1 | 5/2003 | Miyamoto et al. |
| 2003/0089982 A1 | 5/2003 | Feurle |
| 2003/0107118 A1 | 6/2003 | Pflughaupt et al. |
| 2003/0107908 A1 | 6/2003 | Jang et al. |
| 2003/0205801 A1 | 11/2003 | Baik et al. |
| 2003/0211660 A1 | 11/2003 | Lim et al. |
| 2004/0016999 A1 | 1/2004 | Misumi |
| 2004/0061211 A1 | 4/2004 | Michii et al. |
| 2004/0061577 A1 | 4/2004 | Breisch et al. |
| 2004/0090756 A1 | 5/2004 | Ho et al. |
| 2004/0112088 A1 | 6/2004 | Ueda et al. |
| 2004/0145042 A1 | 7/2004 | Morita et al. |
| 2004/0145054 A1 | 7/2004 | Bang et al. |
| 2004/0164382 A1 | 8/2004 | Gerber et al. |
| 2004/0168826 A1 | 9/2004 | Jiang et al. |
| 2004/0184240 A1 | 9/2004 | Su |
| 2004/0201111 A1 | 10/2004 | Thurgood |
| 2005/0116358 A1 | 6/2005 | Haba |
| 2005/0194672 A1 | 9/2005 | Gibson et al. |
| 2005/0206585 A1 | 9/2005 | Stewart et al. |
| 2005/0243590 A1 | 11/2005 | Lee et al. |
| 2005/0258532 A1 | 11/2005 | Yoshikawa et al. |
| 2006/0004981 A1 | 1/2006 | Bains |
| 2006/0081983 A1 | 4/2006 | Humpston et al. |
| 2006/0087013 A1 | 4/2006 | Hsieh |
| 2006/0091518 A1 | 5/2006 | Grafe et al. |
| 2006/0170093 A1 | 8/2006 | Pendse |
| 2006/0207788 A1 | 9/2006 | Yoon et al. |
| 2006/0290005 A1 | 12/2006 | Thomas et al. |
| 2007/0025131 A1 | 2/2007 | Ruckerbauer et al. |
| 2007/0108592 A1 | 5/2007 | Lai et al. |
| 2007/0120245 A1 | 5/2007 | Yoshikawa et al. |
| 2007/0143553 A1 | 6/2007 | LaBerge |
| 2007/0187836 A1 | 8/2007 | Lyne |
| 2007/0241441 A1 | 10/2007 | Choi et al. |
| 2007/0260841 A1 | 11/2007 | Hampel et al. |
| 2008/0012110 A1 | 1/2008 | Chong et al. |
| 2008/0052462 A1 | 2/2008 | Blakely et al. |
| 2008/0061423 A1 | 3/2008 | Brox et al. |
| 2008/0088033 A1 | 4/2008 | Humpston et al. |
| 2008/0098277 A1 | 4/2008 | Hazelzet |
| 2008/0150155 A1 | 6/2008 | Periaman et al. |
| 2008/0182443 A1 | 7/2008 | Beaman et al. |
| 2008/0185705 A1 | 8/2008 | Osborn et al. |
| 2008/0191338 A1 | 8/2008 | Park et al. |
| 2008/0230888 A1 | 9/2008 | Sasaki |
| 2008/0256281 A1 | 10/2008 | Fahr et al. |
| 2008/0265397 A1 | 10/2008 | Lin et al. |
| 2009/0001574 A1 | 1/2009 | Fang et al. |
| 2009/0065948 A1 | 3/2009 | Wang |
| 2009/0108425 A1 | 4/2009 | Lee et al. |
| 2009/0140442 A1 | 6/2009 | Lin |
| 2009/0200680 A1 | 8/2009 | Shinohara et al. |
| 2009/0250255 A1 | 10/2009 | Shilling et al. |
| 2009/0250822 A1 | 10/2009 | Chen et al. |
| 2009/0294938 A1 | 12/2009 | Chen |
| 2009/0314538 A1 | 12/2009 | Jomaa et al. |
| 2010/0052111 A1 | 3/2010 | Urakawa |
| 2010/0102428 A1 | 4/2010 | Lee et al. |
| 2010/0182040 A1 | 7/2010 | Feng et al. |
| 2010/0244272 A1 | 9/2010 | Lee et al. |
| 2010/0244278 A1 | 9/2010 | Shen |
| 2010/0295166 A1 | 11/2010 | Kim |
| 2010/0301466 A1 | 12/2010 | Taoka et al. |
| 2010/0327457 A1 | 12/2010 | Mabuchi |
| 2011/0042824 A1 | 2/2011 | Koide |
| 2011/0084758 A1 | 4/2011 | Shibata et al. |
| 2011/0110165 A1 | 5/2011 | Gillingham et al. |
| 2011/0140247 A1 | 6/2011 | Pagaila et al. |
| 2011/0149493 A1 | 6/2011 | Kwon et al. |
| 2011/0193178 A1 | 8/2011 | Chang et al. |
| 2011/0193226 A1 | 8/2011 | Kirby et al. |
| 2011/0254156 A1 | 10/2011 | Lin |
| 2012/0018863 A1 | 1/2012 | Oganesian et al. |
| 2012/0020026 A1 | 1/2012 | Oganesian et al. |
| 2012/0153435 A1 | 6/2012 | Haba et al. |
| 2012/0155049 A1 | 6/2012 | Haba et al. |
| 2012/0206181 A1 | 8/2012 | Lin et al. |
| 2012/0217645 A1 | 8/2012 | Pagaila |
| 2012/0313239 A1 | 12/2012 | Zohni |
| 2012/0313253 A1 | 12/2012 | Nakadaira et al. |
| 2013/0009308 A1 | 1/2013 | Kwon |
| 2013/0009318 A1 | 1/2013 | Chia et al. |
| 2013/0015590 A1 | 1/2013 | Haba et al. |
| 2013/0082394 A1 | 4/2013 | Crisp et al. |
| 2013/0083583 A1 | 4/2013 | Crisp et al. |
| 2013/0168843 A1 | 7/2013 | Zohni |
| 2013/0286707 A1 | 10/2013 | Crisp et al. |
| 2013/0307138 A1 | 11/2013 | Crisp et al. |
| 2014/0042644 A1 | 2/2014 | Haba et al. |
| 2014/0055941 A1 | 2/2014 | Crisp et al. |
| 2014/0055942 A1 | 2/2014 | Crisp et al. |
| 2014/0055970 A1 | 2/2014 | Crisp et al. |

FOREIGN PATENT DOCUMENTS

| | | |
|---|---|---|
| JP | 63-232389 | 9/1988 |
| JP | 64-001257 A | 1/1989 |
| JP | 2002-076252 A | 3/2002 |
| JP | 2004-063767 A | 2/2004 |
| JP | 2008-198841 A | 8/2008 |
| JP | 3143893 U | 8/2008 |
| JP | 2010-098098 A | 4/2010 |
| JP | 2011155203 A | 8/2011 |
| KR | 2001-0002214 A | 1/2001 |
| KR | 2005-0119414 A | 12/2005 |
| KR | 2006-0120365 A | 11/2006 |
| KR | 2007-0088177 A | 8/2007 |
| KR | 2009-0008341 A | 1/2009 |
| KR | 2009-0086314 A | 8/2009 |
| TW | 312044 | 8/1997 |
| TW | 428258 | 4/2001 |
| TW | 429561 | 4/2001 |
| TW | 478137 B | 3/2002 |
| TW | 567593 B | 12/2003 |
| TW | M338433 U | 8/2008 |
| TW | 200842998 A | 11/2008 |

(56) References Cited

FOREIGN PATENT DOCUMENTS

| TW | 200901194 A | 1/2009 |
|---|---|---|
| TW | 200926312 A | 6/2009 |
| TW | M363079 U | 8/2009 |
| TW | M398313 | 2/2011 |
| TW | 201115659 A | 5/2011 |
| TW | 201208004 | 2/2012 |
| TW | M426922 U | 4/2012 |
| TW | 201222684 | 6/2012 |
| TW | 201234556 A | 8/2012 |
| WO | 2010120310 A1 | 10/2010 |

OTHER PUBLICATIONS

U.S. Appl. No. 13/306,300, filed Nov. 29, 2011.
U.S. Appl. No. 13/346,201, filed Jan. 9, 2012.
U.S. Appl. No. 13/080,876, filed Apr. 6, 2011.
U.S. Appl. No. 13/306,068, filed Nov. 29, 2011.
U.S. Appl. No. 13/346,185, filed Jan. 9, 2012.
U.S. Appl. No. 13/337,565, filed Dec. 27, 2011.
U.S. Appl. No. 13/440,313, filed Apr. 5, 2012.
U.S. Appl. No. 13/439,317, filed Apr. 5, 2012.
U.S. Appl. No. 13/440,212, filed Apr. 5, 2012.
U.S. Appl. No. 13/439,286, filed Apr. 5, 2012.
U.S. Appl. No. 13/354,747, filed Jan. 20, 2012.
U.S. Appl. No. 13/354,772, filed Jan. 20, 2012.
Kang, et al., 8GB 3D DDR3 DRAM Using Through-Silicon-Via Technology, IEEE, International Solid-State Circuits Conference, 2009, pp. 130-132.
U.S. Appl. No. 13/337,575, filed Dec. 27, 2011.
U.S. Appl. No. 13/440,515, filed Apr. 5, 2012.
Sandforce, "SF-2200 & SF-2100 Client SSD Processors", 2011.
U.S. Appl. No. 13/439,299, filed Apr. 4, 2012.
U.S. Appl. No. 13/439,354, filed Apr. 4, 2012.
U.S. Appl. No. 13/439,273, filed Apr. 4, 2012.
U.S. Appl. No. 13/439,228, filed Apr. 4, 2012.
U.S. Appl. No. 13/440,299, filed Apr. 5, 2012.
U.S. Appl. No. 13/440,290, filed Apr. 5, 2012.
U.S. Appl. No. 13/440,199, filed Apr. 5, 2012.
U.S. Appl. No. 13/440,280, filed Apr. 5, 2012.
Elpida User's Manual, "Introduction to GDDR5 SGRAM", Document No. E1600E10 (Ver. 1.0), Published Mar. 2010, Japan, URL: http:www.elpida.com.
Hynix, "2GB (64Mx32) GDDR5 SGRAM HRGQ2H24AFR", Nov. 2011-Feb. 2012.
Partial International Search Report dated Oct. 26, 2012 in International Patent Appl. No. PCT/US2012/046049.
Partial International Search Report dated Oct. 12, 2012 in International Patent Appl. No. PCT/US2012/046249.
Partial International Search Report dated Oct. 12, 2012 in International Patent Appl. No. PCT/US2012/046255.
US Non-Final Office Action for U.S. Appl. No. 13/440,199 dated Aug. 31, 2012.
US Non-Final Office Action for U.S. Appl. No. 13/440,280 dated Aug. 31, 2012.
US Amendment for U.S. Appl. No. 13/440,280 dated Nov. 30, 2012.
US Amendment for U.S. Appl. No. 13/440,199 dated Nov. 30, 2012.
US Non Final Office Action dated Oct. 18, 2012 for U.S. Appl. No. 13/439,299.
International Search Report and Written Opinion for Application No. PCT/US2012/046049 dated Jan. 10, 2013.
International Search Report and Written Opinion for Application No. PCT/US2012/046049 dated Nov. 29, 2012.
US Amendment for U.S. Appl. No. 13/439,299 dated Jan. 18, 2013.
Partial Search Report for Application No. PCT/US2012/057554 dated Jan. 24, 2013.
Partial Search Report for Application No. PCT/US2012/058273 dated Jan. 24, 2013.
Partial Search Report for Application No. PCT/US2012/057170 dated Jan. 31, 2013.
Partial Search Report for Application No. PCT/US2012/000425 dated Jan. 30, 2013.
Partial Search Report for Application No. PCT/US2012/058557 dated Feb. 4, 2013.
International Search Report and Written Opinion for Application No. PCT/US2012/057563 dated Mar. 5, 2013.
International Search Report and Written Opinion for Application No. PCT/US2012/057554 dated Feb. 28, 2013.
International Search Report and Written Opinion for Application No. PCT/US2012/057200 dated Mar. 1, 2013.
International Search Report and Written Opinion for Application No. PCT/US2012/058273 dated Mar. 6, 2013.
International Search Report and Written Opinion for Application No. PCT/US2012/058557 dated Mar. 12, 2013.
International Search Report and Written Opinion for Application No. PCT/US2012/046249 dated Mar. 20, 2013.
International Search Report and Written Opinion for Application No. PCT/US2012/057170 dated Mar. 22, 2013.
International Search Report and Written Opinion for Application No. PCT/US2012/058423 dated Mar. 20, 2013.
International Search Report and Written Opinion dated Mar. 21, 2013 for Application No. PCT/US2012/057911.
International Search Report and Written Opinion for Application No. PCT/US2012/046255 dated Mar. 20, 2013.
International Search Report and Written Opinion dated Mar. 21, 2013 for Application No. PCT/US2012/000425.
International Search Report and Written Opinion for Application No. PCT/US2012/058407 dated Mar. 28, 2013.
International Search Report and Written Opinion for Application No. PCT/US2012/057179 dated Apr. 4, 2013.
International Search Report and Written Opinion for Application No. PCT/US2012/057895 dated Jun. 10, 2013.
International Search Report and Written Opinion for Application No. PCT/US2012/058434 dated Jun. 21, 2013.
International Search Report and Written Opinion for Application No. PCT/US2012/058398 dated Jul. 4, 2013.
International Search Report and Written Opinion for Application No. PCT/US2012/058229 dated Jul. 3, 2013.
International Search Report and Written Opinion for Application No. PCT/US2012/057810 dated Jul. 23, 2013.
International Search Report for Application No. PCT/US2012/057173 dated Aug. 5, 2013.
International Search Report for Application No. PCT/US2012/057905 dated Aug. 20, 2013.
International Search Report and Written Opinion for Application No. PCT/US2012/057204 dated Aug. 30, 2013.
International Search Report and Written Opinion for Application No. PCT/US2013/056773 dated Dec. 4, 2013.
International Search Report and Written Opinion for Application PCT/US2013/056777 dated Jan. 2, 2014.
U.S. Appl. No. 13/839,402, filed Mar. 15, 2013.
U.S. Appl. No. 13/841,052, filed Mar. 15, 2013.
U.S. Appl. No. 13/840,542, filed Mar. 15, 2013.
U.S. Appl. No. 13/840,353, filed Mar. 15, 2013.
U.S. Appl. No. 61/477,877, filed Apr. 21, 2011.
Office Action from Taiwan for Application No. 101125197 dated May 19, 2014.
Taiwanese Allowance and Search Report for Application No. 101136592 dated Jun. 27, 2014.
Taiwanese Office Action for Application No. 101136594 dated Aug. 13, 2014.
Taiwanese Office Action for Application No. 101136595 dated Oct. 27, 2014.
International Search Report and Written Opinion for Application No. PCT/US2014/041709 dated Nov. 4, 2014.
Taiwanese Office Action for Application No. 101136575 dated Oct. 28, 2014.
International Search Report and Written Opinion for Application No. PCT/US2013/056777 dated Jan. 21, 2015.
Taiwanese Office Action for Application No. 101136585 dated Jan. 21, 2015.

(56) References Cited

OTHER PUBLICATIONS

Taiwanese Notice of Allowance for Application No. 102130518 dated Mar. 31, 2015.
Taiwanese Office Action for Application No. 101136606 dated Mar. 27, 2015.
Taiwanese Office Action for Application No. 101136578 dated May 12, 2015.
Taiwanese Office Action for Application No. 101136577 dated May 12, 2015.
Taiwanese Office Action for Application No. 102130519 dated May 7, 2015.
Written Opinion of the International Preliminary Examining Authority for Application No. PCT/US2014/041709 dated Jun. 1, 2015.
Taiwanese Office Action for Application No. 101125193 dated Aug. 4, 2015.
International Search Report and Written Opinion for Application No. PCT/US2015/042726 dated Nov. 12, 2015.

* cited by examiner

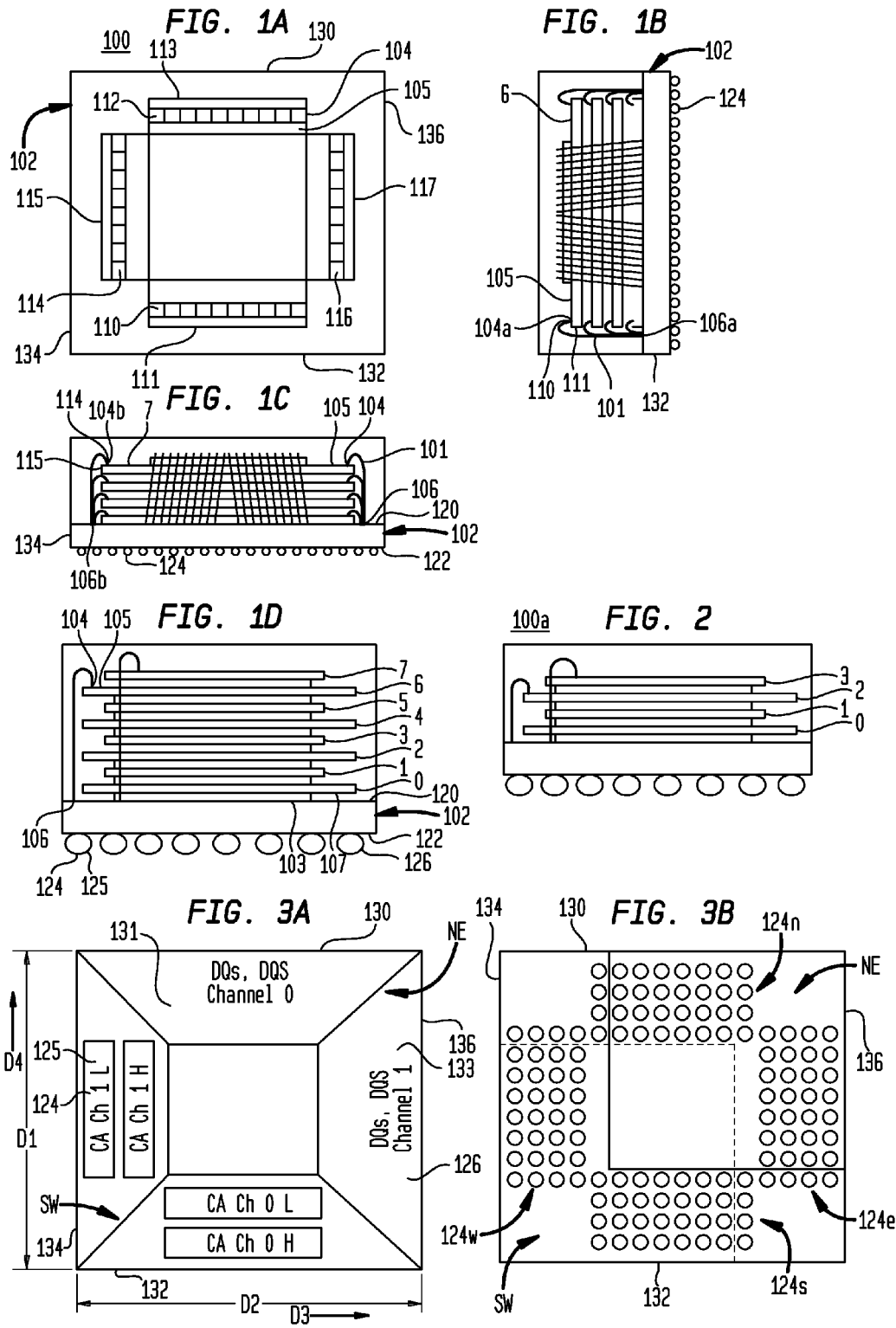

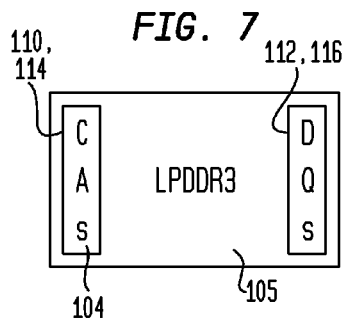
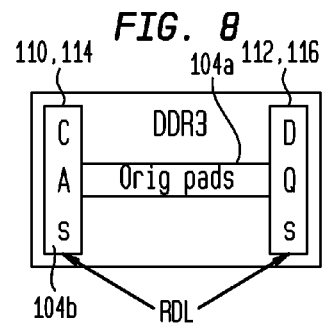
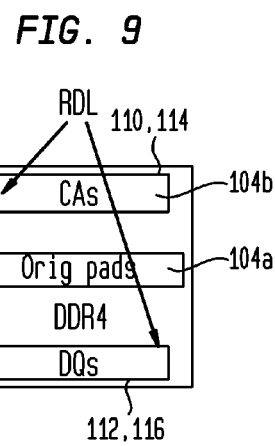
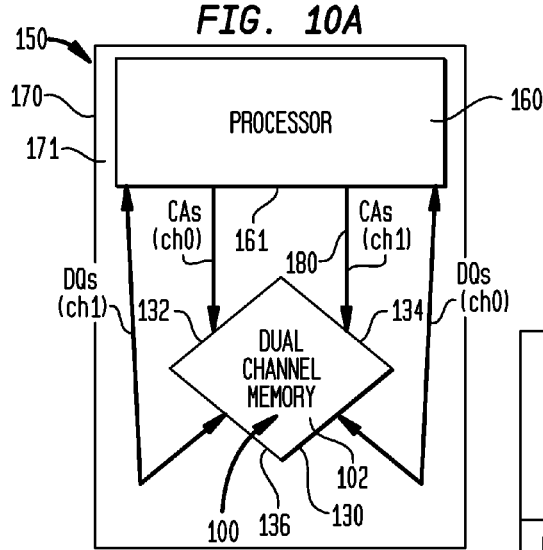
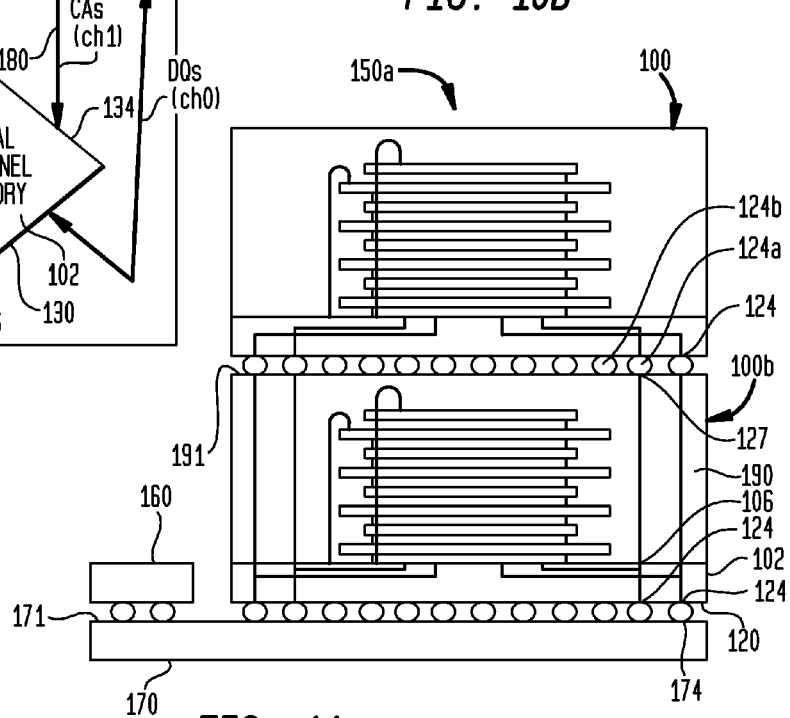
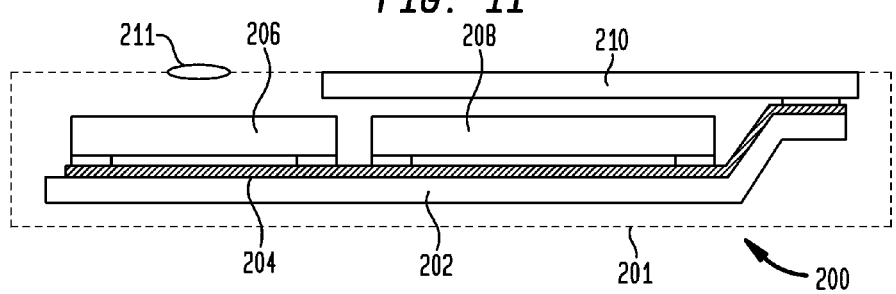

SINGLE PACKAGE DUAL CHANNEL MEMORY WITH CO-SUPPORT

CROSS-REFERENCE TO RELATED APPLICATIONS

The present application is a continuation of U.S. patent application Ser. No. 14/075,020, filed Nov. 8, 2013, now U.S. Pat. No. 9,070,423, which claims the benefit of the filing date of U.S. Provisional Patent Application No. 61/833,900 filed Jun. 11, 2013, the disclosures of which are hereby incorporated herein by reference.

BACKGROUND OF THE INVENTION

The subject matter of the present application relates to microelectronic packaging, and more specifically to multi-chip microelectronic memory packages, such as those that include multiple dynamic random access memory ("DRAM") chips in the same package.

Microelectronic elements generally comprise a thin slab of a semiconductor material, such as silicon or gallium arsenide, commonly called a die or a semiconductor chip. Semiconductor chips are commonly provided as individual, packaged units in form of microelectronic packages. In some designs, the semiconductor chip is mounted to a substrate or chip carrier, which is in turn mounted on a circuit panel, such as a printed circuit board.

The active circuitry is fabricated in a first face of the semiconductor chip (e.g., a front face or surface). To facilitate electrical connection to the active circuitry, the chip is provided with bond pads on the same face. The bond pads are typically placed in a regular array either around the edges of the die or, for many memory chips, in the die center. The bond pads are generally made of a conductive metal, such as copper, or aluminum, around 0.5 micron ($\mu$m) thick. The bond pads could include a single layer or multiple layers of metal. The size of the bond pads will vary with the specific type of chip but will typically measure tens to hundreds of microns on a side.

Size is a significant consideration in any physical arrangement of chips. The demand for more compact physical arrangements of chips has become even more intense with the rapid progress of portable electronic devices. Merely by way of example, devices commonly referred to as "smart phones" and "tablet computers" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/Os." These I/Os must be interconnected with the I/Os of other chips. The components which form the interconnections should not greatly increase the size of the assembly. Similar needs arise in other applications as, for example, in data servers such as those used in internet search engines. For example, structures which provide numerous short, interconnects between complex chips can increase the bandwidth of the search engine and reduce its power consumption.

In view of the foregoing, it can be advantageous to assemble multiple chips, particularly memory chips such as DRAMs in multi-chip memory packages. Further improvements can be made to the structure and function of multi-chip memory packages.

BRIEF SUMMARY OF THE INVENTION

In accordance with an aspect of the invention, a microelectronic package can have a support element having first and second oppositely-facing surfaces and a plurality of substrate contacts at the first surface or the second surface, zeroth and first stacked microelectronic elements electrically coupled with the substrate contacts, and terminals at the second surface electrically coupled with the microelectronic elements via the substrate contacts.

The support element can have oppositely-facing north and south edges adjacent to oppositely-facing east and west edges each extending between the north and south edges. The second surface can have a southwest region encompassing entire lengths of the south and west edges and extending in orthogonal directions from each of the south and west edges one-third of each distance toward the north edge and toward the east edge, respectively.

Each microelectronic element can have a memory storage array and first and second columns of element contacts extending along a front face thereof adjacent and parallel to first and second opposite edges of the front face, respectively. The first and second edges of the zeroth microelectronic element can be disposed adjacent the south and north edges, respectively, and the first and second edges of the first microelectronic element can be disposed adjacent the west and east edges, respectively.

The terminals can include first terminals at the southwest region, the first terminals configured to carry address information usable by circuitry within the microelectronic package to determine an addressable memory location from among all the available addressable memory locations of the memory storage arrays of at least one of the zeroth or first microelectronic elements.

In one embodiment, the second surface can have a northeast region encompassing entire lengths of the north and east edges and extending in orthogonal directions from each of the north and east edges one-third of each distance toward the south edge and toward the west edge, respectively. The terminals can also include second terminals at the northeast region. The second terminals can be configured to carry second information other than the information carried by the first terminals. The second information can include data signals. In an exemplary embodiment, the second terminals can be configured to carry all data signals to and from the microelectronic package. All of the second terminals can be located in the northeast region.

In a particular example, the second terminals can be arranged at locations within a plurality of north rows of terminals extending parallel to the north edge, and within a plurality of east columns of terminals extending parallel to the east edge. The first terminals can be arranged at locations within a plurality of south rows of terminals extending parallel to the south edge, and within a plurality of west columns of terminals extending parallel to the west edge. In one example, the second terminals in the north rows of terminals and the first terminals in the south rows of terminals can be electrically coupled with the element contacts of the zeroth microelectronic element, and the second terminals in the east columns of terminals and the first terminals in the west columns of terminals can be electrically coupled with the element contacts of the first microelectronic element.

In a particular embodiment, the microelectronic package can also include second and third microelectronic elements stacked with the zeroth and first microelectronic elements, each of the second and third microelectronic elements having a memory storage array and first and second columns of element contacts extending along a front face thereof adjacent and parallel to first and second opposite edges of the front face, respectively, the first and second edges of the second microelectronic element adjacent the south and north edges, respectively, and the first and second edges of the third microelectronic element adjacent the west and east edges, respectively.

In an exemplary embodiment, the microelectronic package can also include fourth, fifth, sixth, and seventh microelectronic elements stacked with the zeroth, first, second, and third microelectronic elements, each of the fourth, fifth, sixth, and seventh microelectronic elements having a memory storage array and first and second columns of element contacts extending along a front face thereof adjacent and parallel to first and second opposite edges of the front face, respectively, the first and second edges of each of the fourth and sixth microelectronic elements adjacent the south and north edges, respectively, and the first and second edges of each of the fifth and seventh microelectronic elements adjacent the west and east edges, respectively.

In a particular example, the microelectronic package can also include an eighth microelectronic element stacked with the zeroth, first, second, third, fourth, fifth, sixth, and seventh microelectronic elements, the eighth microelectronic element having a memory storage array and first and second columns of element contacts extending along a front face thereof adjacent and parallel to first and second opposite edges of the front face, respectively, the first and second edges of each of the eighth microelectronic element adjacent the south and north edges, respectively.

In one embodiment, a zeroth subset of the second terminals that are electrically coupled to the zeroth and second microelectronic elements can comprise a zeroth memory channel, a first subset of the second terminals that are electrically coupled to the first and third microelectronic elements can comprise a first memory channel, and the zeroth and first memory channels can be configured to be operated independently from one another.

In accordance with another aspect of the invention, a microelectronic assembly can include an upper microelectronic package and a lower microelectronic package, each microelectronic package as described above. The terminals can be bottom terminals. The lower microelectronic package can also include an encapsulant at least partially covering the microelectronic elements and top terminals at a top surface of the encapsulant electrically coupled with the microelectronic elements of the lower microelectronic package via the substrate contacts, the bottom terminals of the upper microelectronic package joined to the top terminals of the lower microelectronic package.

In a particular embodiment, the bottom terminals of each of the microelectronic packages can include second terminals configured to carry second information other than the information carried by the first terminals, the second information including data signals. The microelectronic assembly can also include a support structure having a set of conductors configured to carry 64 bits of the second information between the microelectronic packages and a microprocessor, wherein the second terminals of the upper microelectronic package are configured to transfer 32 bits per clock cycle to the set of conductors, and the second terminals of the lower microelectronic package are configured to transfer 32 bits per clock cycle to the set of conductors.

In one embodiment, each of the second terminals of the upper microelectronic package can overlie and can be electrically connected with a corresponding one of the second terminals of the lower microelectronic package having the same signal assignment. Each of the second terminals of each of the upper and lower microelectronic packages can be electrically connected with each of the microelectronic elements in each of the upper and lower microelectronic packages. In a particular example, each of the second terminals of the upper microelectronic package can overlie and can be electrically connected with a corresponding no-connect terminal of the lower microelectronic package that is electrically insulated from the microelectronic elements within the lower microelectronic package. Each of the second terminals of the lower microelectronic package can underlie and can be electrically connected with a corresponding no-connect terminal of the upper microelectronic package that is electrically insulated from the microelectronic elements within the upper microelectronic package.

In accordance with yet another aspect of the invention, a microelectronic assembly can include a support structure and the microelectronic package as described above mounted to a major surface of the support structure. The microelectronic assembly can also include a microprocessor mounted to the major surface of the support structure and a set of conductors on the support structure configured to carry the address information between the microelectronic package and the microprocessor. In one embodiment, the south and west edges can face toward an edge of the microprocessor, and the north and east edges can face away from the edge of the microprocessor, so that the terminals in the southwest region are closer to the edge of the microprocessor than terminals in the northeast region.

In a particular embodiment, the microelectronic assembly can also include a plurality of co-support contacts at the major surface of the support structure, the co-support contacts coupled to the set of conductors and joined with corresponding ones of the terminals of the microelectronic package. The co-support contacts can have address information assignments arranged according to (a) a first predetermined arrangement for connection with a first type of the microelectronic package in which the microelectronic elements are configured to sample the address information coupled thereto through the co-support contacts at a first sampling rate, and according to (b) a second predetermined arrangement for connection with a second type of the microelectronic package in which the microelectronic elements are configured to sample the address information coupled thereto through the co-support contacts at a second sampling rate greater than the first sampling rate. In one example, the microelectronic elements in the first type of the microelectronic package can be of type DDRx, and the microelectronic elements in the second type of the microelectronic package can be of type LPDDRx.

In accordance with still another aspect of the invention, a microelectronic assembly can include an upper microelectronic package and a lower microelectronic package, the upper microelectronic package as described above. The terminals can be are bottom terminals. The lower microelectronic package can also include an encapsulant at least partially covering a processor therein and top terminals at a top surface of the encapsulant electrically coupled with the processor. The bottom terminals of the upper microelectronic package can be joined to the top terminals of the lower microelectronic package.

In a particular embodiment, the top terminals of the lower microelectronic package can have address information assignments arranged according to (a) a first predetermined arrangement for connection with a first type of the upper microelectronic package in which the microelectronic elements are configured to sample the address information coupled thereto through the top terminals at a first sampling rate, and according to (b) a second predetermined arrangement for connection with a second type of the upper microelectronic package in which the microelectronic elements are configured to sample the address information coupled thereto through the top terminals at a second sampling rate greater than the first sampling rate.

BRIEF DESCRIPTION OF THE DRAWINGS

FIG. 1A is a diagrammatic top plan view of a microelectronic package according to an embodiment of the present invention.

FIG. 1B is a side elevational view of the microelectronic package of FIG. 1A, taken from the east edge of the package.

FIG. 1C is another side elevational view of the microelectronic package of FIG. 1A, taken from the south edge of the package.

FIG. 1D is an enlarged side elevational view of the microelectronic package of FIG. 1A shown with some of the wire bonds omitted, taken from the south edge of the package.

FIG. 2 is an enlarged side elevational view of a variation of the microelectronic package of FIG. 1A according to another embodiment.

FIG. 3A is a diagrammatic top plan view of the second surface of the support element of the microelectronic package of FIG. 1A.

FIG. 3B is a diagrammatic top plan view of the second surface of the support element of the microelectronic package of FIG. 1A, showing a possible configuration of terminals.

FIG. 7 is a diagrammatic top plan view of a microelectronic element that can be included in the microelectronic package of FIG. 1A or the microelectronic package of FIG. 2.

FIG. 8 is a diagrammatic top plan view of another microelectronic element that can be included in the microelectronic package of FIG. 1A or the microelectronic package of FIG. 2.

FIG. 9 is a diagrammatic top plan view of yet another microelectronic element that can be included in the microelectronic package of FIG. 1A or the microelectronic package of FIG. 2.

FIG. 10A is a schematic diagram illustrating a possible interconnection arrangement of the microelectronic package of FIG. 1A in a system and its interconnections with a processor.

FIG. 10B is a schematic diagram illustrating a possible interconnection arrangement of the microelectronic package of FIG. 1A in a package-on-package system.

FIG. 11 is a schematic depiction of a system according to one embodiment of the invention.

DETAILED DESCRIPTION

Figure 4:
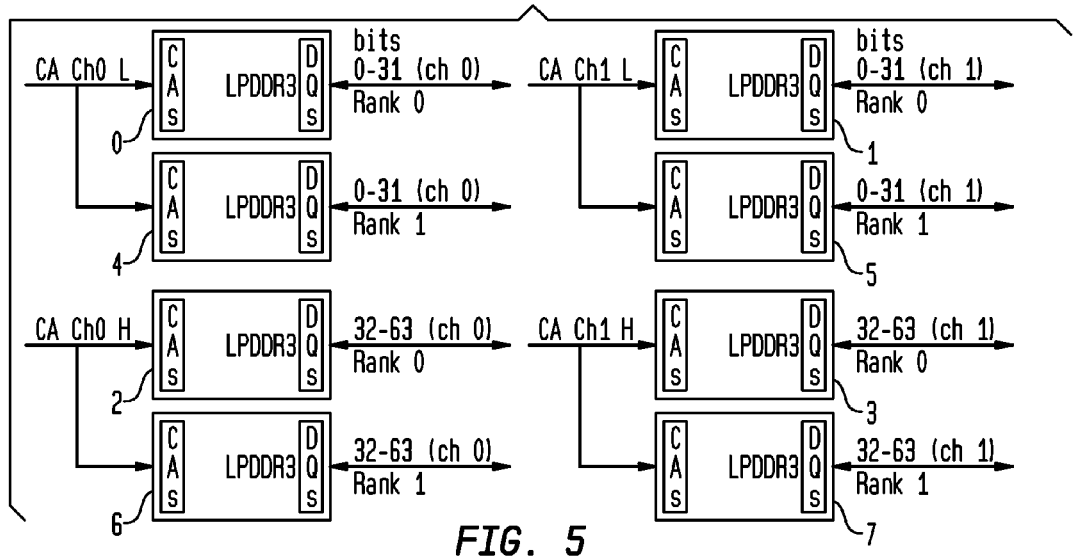
FIG. 4 is a block diagram of a dual rank configuration of microelectronic elements that is one potential configuration of the microelectronic package of FIG. 1A.

With reference to the various Figures as further described herein, a variety of multi-chip microelectronic package configurations are provided that can each have a common package terminal bailout on a surface of the package for interconnection of terminals to a common interface on a circuit panel or other component of a system. In such way, the common interface on the circuit panel or other component can be standardized for connection to all such microelectronic packages, even though the particular microelectronic package may vary significantly from another such co-supported package type in the number of semiconductor memory chips (hereinafter, "chips") therein, the particular type of chip, and the particular standard by which input signals are provided thereto, e.g., address information, or command address bus signals, as well as number of ranks of memory supported by the package.

Thus, for example, microelectronic packages according to the invention can include a plurality of chips in accordance with the standard "LPDDR3" and its follow-on standards (hereinafter, such standards referred to collectively as "LPD-DRx"); or a plurality of chips in accordance with the standard "DDR3"; or a plurality of chips in accordance with the standard "DDR4" (hereinafter, when appropriate such DDR3 and DDR4 standards referred to collectively as "DDRx").

Certain embodiments of the invention provide a package or microelectronic assembly in which a microelectronic element, e.g., a semiconductor chip, or stacked arrangement of semiconductor chips, is configured to predominantly provide a memory storage array function. In such microelectronic element, the number of active devices, e.g., transistors, therein that are configured, i.e., constructed and interconnected with other devices, to provide memory storage array function, is greater than the number of active devices that are configured to provide any other function. Thus, in one example, a microelectronic element such as a DRAM chip may have memory storage array function as its primary or sole function. Alternatively, in another example, such microelectronic element may have mixed use and may incorporate active devices configured to provide memory storage array function, and may also incorporate other active devices configured to provide another function such as processor function, or signal processor or graphics processor function, among others. In this case, the microelectronic element may still have a greater number of active devices configured to provide the memory storage array function than any other function of the microelectronic element.

FIGS. 1A-1D illustrate an example implementation of a microelectronic package 100 according to several of the embodiments herein. As seen therein, microelectronic elements 0, 1, 2, 3, 4, 5, 6, and 7 are stacked face up above a support element 102 such as a supporting dielectric element, e.g., a tape used in tape automated bonding ("TAB"). In one example, the support element 102 can consist essentially of a dielectric element having a coefficient of thermal expansion in a plane of the support element of less than 10 parts per million per degree Centigrade in a plane of the support element ("ppm/° C.").

Each of the microelectronic elements 0-7 can have a memory storage array. The support element 102 can have oppositely-facing north and south edges 130, 132 adjacent to oppositely-facing east and west edges 136, 134 each extending between the north and south edges. As used herein, the directions north, south, east and west are merely used for convenience in describing the orientations and directions in the frame of reference of a particular microelectronic package and do not correspond to geographic directions. The numbering of chips 0 through 7 remains the same throughout the Figures and the following description.

As shown in FIGS. 1A-1D, element contacts 104 at a front face 105 of each of the microelectronic elements 0-7 are wire bonded to corresponding substrate contacts 106 at a first surface 120 of the support element 102. The wire bonds 101 can extend above the front face 105 of each of the microelectronic elements 0-7, the wire bonds being electrically coupled to the element contacts 104 of each of the microelectronic elements and the substrate contacts 106.

The microelectronic elements 0-7 are placed in the stack in an interleaved configuration such that the even-numbered microelectronic elements (i.e., 0, 2, 4, 6, etc.) are spaced by or alternatingly interleaved in a single stacked arrangement with the odd-numbered microelectronic elements (i.e., 1, 3, 5, 7, etc.). The microelectronic elements 0-7 are placed in the stack in a configuration such that the odd-numbered microelectronic elements appear to be rotated 90 degrees in their horizontal planes relative to the even-numbered microelectronic elements.

A rear face 107 of the zeroth microelectronic element 0 opposite the front face 105 thereof can be disposed adjacent the first surface 120 of the support element 102. The rear face 107 of the first microelectronic element 1 can overlie the front face 105 of the zeroth microelectronic element 0. This pattern can continue for the remaining microelectronic elements 2-7, with the rear face 107 of each microelectronic element n overlying the front face 105 of the microelectronic element n−1.

As can be seen in FIG. 1D, one or more adhesive layers 103 can be disposed between a rear face 107 of the zeroth microelectronic element 0 opposite the front face 105 thereof and the first surface 120 of the support element 102, and one or more adhesive layers 103 can be disposed between confronting faces of adjacent ones of the microelectronic elements 0-7.

The even-numbered microelectronic elements 0, 2, 4, in the stack can each be electrically coupled with the substrate contacts 106 through element contacts 104 in first and second rows 110 and 112. The first and second rows 110, 112 of element contacts 104 of each of the even-numbered microelectronic elements 0, 2, 4, 6 can extend along the front face 105 of the respective microelectronic element adjacent and parallel to first and second opposite edges 111, 113 of the front face, respectively. The first and second edges 111, 113 of the front face 105 of each of the even-numbered microelectronic elements 0, 2, 4, 6 can be oriented towards the south and north edges 132, 130 of the support element 102, respectively.

The first and second rows 110, 112 of element contacts 104 of each of the even-numbered microelectronic elements 0, 2, 4, 6 can be wire bonded to corresponding ones of the substrate contacts 106 at the first surface 120 of the support element 102 that lie between the south and north edges 132, 130 of the support element and the corresponding edges 111, 113 of the front face 105 of the even-numbered microelectronic elements 0, 2, 4, 6. For example, as shown in FIG. 1B, a particular contact 104a in the first row 110 of the sixth microelectronic element 6 is wire bonded to a corresponding substrate contact 106a at the first surface 120 of the support element 102 that lies between the south edge 132 of the support element and the corresponding first edge 111 of the front face 105 of the sixth microelectronic element.

The first row 110 of element contacts 104 of each of the even-numbered microelectronic elements 0, 2, 4, 6 can be configured to carry all of the address information usable by circuitry within the respective microelectronic element to determine an addressable memory location from among all the available addressable memory locations of a memory storage array within the respective microelectronic element. The second row 112 of element contacts 104 of each of the even-numbered microelectronic elements 0, 2, 4, 6 can be configured to carry all of the data information usable by circuitry within the respective microelectronic element.

The odd-numbered microelectronic elements 1, 3, 5, 7 in the stack can each be electrically coupled with the substrate contacts 106 through element contacts 104 in first and second columns 114 and 116. The first and second columns 114, 116 of element contacts 104 of each of the odd-numbered microelectronic elements 1, 3, 5, 7 can extend along the front face 105 of the respective microelectronic element adjacent and parallel to first and second opposite edges 115, 117 of the front face, respectively. The first and second edges 115, 117 of the front face 105 of each of the odd-numbered microelectronic elements 1, 3, 5, 7 can be oriented towards the west and east edges 134, 136 of the support element 102, respectively.

The first and second columns 114, 116 of element contacts 104 of each of the odd-numbered microelectronic elements 1, 3, 5, 7 can be wire bonded to corresponding ones of the substrate contacts 106 at the first surface 120 of the support element 102 that lie between the west and east edges 134, 136 of the support element and the corresponding edges 115, 117 of the front face 105 of the odd-numbered microelectronic elements 1, 3, 5, 7. For example, as shown in FIG. 1C, a particular contact 104b in the first column 110 of the seventh microelectronic element 7 is wire bonded to a corresponding substrate contact 106b at the first surface 120 of the support element 102 that lies between the west edge 134 of the support element and the corresponding first edge 115 of the front face 105 of the seventh microelectronic element.

The first column 114 of element contacts 104 of each of the odd-numbered microelectronic elements 1, 3, 5, 7 can be configured to carry all of the address information usable by circuitry within the respective microelectronic element to determine an addressable memory location from among all the available addressable memory locations of a memory storage array within the respective microelectronic element. The second column 116 of element contacts 104 of each of the odd-numbered microelectronic elements 1, 3, 5, 7 can be configured to carry all of the data information usable by circuitry within the respective microelectronic element.

The microelectronic package 100 can have terminals 124 at the second surface 122 of the support element 102 electrically coupled with the microelectronic elements 0-7 via the substrate contacts 106. The terminals 124 can include first terminals 125 configured to carry address information usable by circuitry within the microelectronic package 100 to determine an addressable memory location from among all the available addressable memory locations of the memory storage arrays of the microelectronic elements 0-7. The terminals 124 can also include second terminals 126 configured to carry second information other than the information carried by the first terminals 125, the second information including data signals.

Referring to FIG. 3A, in the exemplary terminal bailout of terminals 124 provided in embodiments herein, address information, i.e., information that is sufficient to specify an addressable memory location of a memory storage array within each microelectronic element, is disposed in terminals adjacent to two adjoining edges of the support element 102 (e.g., the south and west edges 132, 134). In one example, the exemplary terminal bailout of terminals 124 can be arranged in an area array arranged in rows and columns at the second surface 122 of the support element 102.

Such address information, which may be grouped together with command information such as a clock used to sample the address information, write enable, column address strobe and row address strobe, collectively, "command address information", can be received on first terminals 125 seen in FIG. 3A that appear, for example, in groups "CA CH 0 L" and "CA CH 0 H" adjacent the south edge 132 of the support element 102, and that appear, for example, in groups "CA CH 1 L" and "CA CH 1 H" adjacent the west edge 134 of the support element.

As seen in FIG. 3A, all of such address information can be input to the package at first terminals 125 that are disposed adjacent to west and south edges 134, 132 of the support element 102. Groups of terminals "CA CH 0 L" and "CA CH 0 H" can be separate or can be interspersed among one another, and the same is true for the groups "CA CH 1 L" and "CA CH 1 H".

The terminals 124 can include first terminals 125 at a southwest region SW of the second surface 122 of the support element 102. The southwest region SW can encompass entire lengths of the south and west edges 132, 134 of the support element 102 and can extend in orthogonal directions from each of the south and west edges one-third of each distance D1, D2 toward the north edge 130 and toward the east edge 136, respectively. In one embodiment, the southwest region can extend in the orthogonal directions from each of the south and west edges 132, 134 no more than 2 mm toward the north edge 130 and toward the east edge 136, respectively.

In one example, all of the first terminals 125 of the microelectronic package 100 can be exposed at the southwest region SW of the second surface 122 of the support element 102, such that the first terminals can be configured to carry all of the address information usable by circuitry within the microelectronic package to determine an addressable memory location from among all the available addressable memory locations of the memory storage arrays of the microelectronic elements 0-7.

All of the first terminals 125 need not be limited to only carrying address information, although they can be so limited in some embodiments. In an exemplary embodiment, the first terminals 125 can be configured to carry clock signals and all of the command signals, address signals, and bank address signals transferred to the microelectronic package 100, the command signals being write enable, row address strobe, and column address strobe, and the clock signals being clocks used for sampling signals carrying the address information or time multiplexed versions thereof.

The first terminals 125 can be arranged at locations within a plurality of south rows of terminals 124s extending in a first one of the orthogonal directions D3 parallel to the south edge 132, and within a plurality of west columns of terminals 124w extending in a second one of the orthogonal directions D4 parallel to the west edge 134. In one embodiment, the plurality of south rows of terminals 124s may include no more than four rows of terminals, and the plurality of west columns of terminals 124w may include no more than four columns of terminals.

The first terminals 125 can be configured to operate the even-numbered microelectronic elements 0, 2, 4, 6 independently from the odd-numbered microelectronic elements 1, 3, 5, 7. In embodiments having four microelectronic elements, such as in FIG. 2, the first terminals 125 can be configured to operate the even-numbered microelectronic elements 0, 2 independently from the odd-numbered microelectronic elements 1, 3. In embodiments having two microelectronic elements, the first terminals 125 can be configured to operate the zeroth microelectronic element 0 independently from the first microelectronic element 1.

In one example, the first terminals 125 in the south rows of terminals 124s in the southwest region SW can be configured to operate the even-numbered microelectronic elements 0, 2, 4, 6 independently from the first terminals in the west columns of terminals 124w, also in the southwest region, that can be configured to operate the odd-numbered microelectronic elements 1, 3, 5, 7.

As further seen in FIG. 3A, data signals to and from the microelectronic package 100 can be carried, for example, by DQ signals and data strobe signals DQS corresponding to the respective memory channels. For example, second terminals 126 carrying all of the DQ signals and DQ strobe signals for the zeroth channel 131 (indicated as "DQs, DQS Channel 0" in FIG. 3A) can be provided adjacent to the north edge 130 of the microelectronic package 100, and all of the DQ signals and DQ strobe signals for the first channel 133 (indicated as "DQs, DQS Channel 1" in FIG. 3A) can be provided adjacent to the east edge 136 of the microelectronic package.

The terminals 124 can include second terminals 126 at a northeast region NE of the second surface 122 of the support element 102. The northeast region NE can encompass entire lengths of the north and east edges 130, 136 of the support element 102 and can extend in orthogonal directions from each of the north and east edges one-third of each distance D1, D2 toward the south edge 132 and toward the west edge 134, respectively. As can be seen in FIG. 3B, the northeast region NE and the southeast region SW can partially overlap, such that one or more of the terminals 124 can be located in both the northeast and southeast regions.

In one example, all of the second terminals 126 of the microelectronic package 100 can be exposed at the northeast region NE of the second surface 122 of the support element 102, such that the second terminals can be configured to carry all data signals to and from the microelectronic package.

The second terminals 126 can be arranged at locations within a plurality of north rows of terminals 124n extending in the first one of the orthogonal directions D3 parallel to the north edge 130, and within a plurality of east columns of terminals 124e extending in the second one of the orthogonal directions D4 parallel to the east edge 136. In one embodiment, the plurality of north rows of terminals 124n may include no more than four rows of terminals, and the plurality of east columns of terminals 124e may include no more than four columns of terminals.

In the microelectronic package 100, the even-numbered microelectronic elements 0, 2, 4, 6, which have their element contacts 104 oriented towards the south and north edges 132, 130 of the support element 102, can be electrically coupled with terminals 124 in the in the south rows of terminals 124s and the north rows of terminals 124n. More specifically, the first terminals 125 in the south rows of terminals 124s and the second terminals 126 in the north rows of terminals 124n can be electrically coupled with the element contacts 104 of the even-numbered microelectronic elements 0, 2, 4, 6.

The first terminals 125 in the south rows of terminals 124s can be configured to carry control information for the even-numbered microelectronic elements 0, 2, 4, 6, and the second terminals 126 in the north rows of terminals 124n can be configured to transfer data signals in accordance with the control information for the even-numbered microelectronic elements 0, 2, 4, 6. The first terminals 125 in the south rows of terminals 124s can be configured to carry address information for the even-numbered microelectronic elements 0, 2, 4, 6, and the second terminals 126 in the north rows of terminals 124n can be configured to transfer data signals to memory storage array locations for the even-numbered microelectronic elements 0, 2, 4, 6 specified by the address information.

The odd-numbered microelectronic elements 1, 3, 5, 7, which have their element contacts 104 oriented towards the west and east edges 134, 136 of the support element 102, can be electrically coupled with terminals 124 in the in the west columns of terminals 124w and the east columns of terminals 124e. More specifically, the first terminals 125 in the west columns of terminals 124w and the second terminals 126 in the east columns of terminals 124e can be electrically coupled with the element contacts 104 of the odd-numbered microelectronic elements 1, 3, 5, 7.

The first terminals 125 in the west columns of terminals 124w can be configured to carry control information for the odd-numbered microelectronic elements 1, 3, 5, 7, and the second terminals 126 in the east columns of terminals 124e can be configured to transfer data signals in accordance with the control information for the odd-numbered microelectronic elements 1, 3, 5, 7. The first terminals 125 in the west columns of terminals 124w can be configured to carry address information for the odd-numbered microelectronic elements 1, 3, 5, 7, and the second terminals 126 in the east columns of terminals 124e can be configured to transfer data signals to memory storage array locations for the odd-numbered microelectronic elements 1, 3, 5, 7 specified by the address information.

In this configuration, the microelectronic package 100 can permit the even-numbered microelectronic elements 0, 2, 4, 6 to be operated independently from the odd-numbered microelectronic elements 1, 3, 5, 7, such that data signals in accordance with the control information for the even-numbered microelectronic elements 0, 2, 4, 6 can be transferred at a time independent from the data signals in accordance with the control information for the odd-numbered microelectronic elements 1, 3, 5, 7.

In one example, the microelectronic package 100 can permit the even-numbered microelectronic elements 0, 2, 4, 6 to be operated independently from the odd-numbered microelectronic elements 1, 3, 5, 7, such that data signals to memory storage array locations for the even-numbered microelectronic elements 0, 2, 4, 6 can be transferred at a time independent from the data signals to memory storage array locations for the odd-numbered microelectronic elements 1, 3, 5, 7, the memory storage array locations for the even-numbered microelectronic elements 0, 2, 4, 6 being different than the memory storage array locations for the odd-numbered microelectronic elements 1, 3, 5, 7.

Each of the second terminals 126 in the north rows of terminals 124n can be electrically insulated from each of the second terminals in the east columns of terminals 124e within the microelectronic package 100. As can be seen in FIG. 3A, a zeroth subset of the second terminals 126 that are electrically coupled to the even-numbered microelectronic elements 0, 2, 4, 6 can comprise a zeroth memory channel 131, and a first subset of the second terminals that are electrically coupled to the odd-numbered microelectronic elements 1, 3, 5, 7 can comprise a first memory channel 133. The zeroth and first memory channels 131, 133 can be configured to be operated independently from one another.

In a particular embodiment where the microelectronic elements 0-7 are of type LPDDRx, the second terminals 126 can be configured to transfer: 32 bits per clock cycle to each of the zeroth and second microelectronic elements 0, 2 for a zeroth memory channel in a zeroth memory rank, 32 bits per clock cycle to each of the first and third microelectronic elements 1, 3 for a first memory channel in the zeroth memory rank, 32 bits per clock cycle to each of the fourth and sixth microelectronic elements 4, 6 for a zeroth memory channel in a first memory rank, and 32 bits per clock cycle to each of the fifth and seventh 5, 7 microelectronic elements for a first memory channel in the first memory rank.

A possible advantage of the arrangement of first terminals 125 and second terminals 126 seen in FIG. 3A will now be described. Per the above description, the terminals 124 of each such microelectronic package 100 constructed in accordance with the embodiments shown herein can be connected to a common connection interface provided on a circuit panel or other such component (e.g., FIG. 10A). In example embodiments, the other such component can be another package or a memory module substrate, among others (e.g., FIG. 10B).

The particular terminal bailout seen in FIG. 3A can be utilized to provide relatively short length connections within the microelectronic package 100 between the first terminals 125 of the microelectronic package and the respective sets of microelectronic elements in the microelectronic package that support the same memory channel.

Specifically, by placing all of the first terminals 125 for the zeroth channel 131 adjacent to the south edge 132 of the support element 102, this facilitates short length electrical connections between those first terminals and the corresponding first row 110 of element contacts 104 on the even-numbered microelectronic elements 0, 2, 4, and 6. In similar fashion, by placing all of the first terminals 125 for the first channel 133 adjacent to the west edge 134 of the support element 102, this facilitates short length electrical connections between those first terminals and the corresponding first column 114 of element contacts 104 on the odd-numbered microelectronic elements 1, 3, 5 and 7.

In LPDDRx-type microelectronic elements, address information is received on both rising and falling edges of the clock that is used for sampling such information. Thus, in LPDDRx-type microelectronic elements, the speed of address signaling on a command address bus is twice that of DDRx-type microelectronic elements, where the address information is received only at one edge of the clock. With the present arrangement, the shorter electrical connections within the microelectronic package 100 can reduce signal propagation time, inductance, and loading from the microelectronic package back onto a command address bus on the circuit panel (e.g., FIG. 10A). By reducing these parameters on the command address bus, signals can be received at the microelectronic package 100 at higher speeds than otherwise possible. Accordingly, the package arrangement shown provides a particular performance advantage when used with LPDDRx-type microelectronic elements.

In a variation of the microelectronic package 100 shown in FIGS. 1A-1D, a nine-chip package can be provided in which five even-numbered microelectronic elements 0, 2, 4, 6, and 8 are oriented in the same north-south orientation as the even-numbered microelectronic elements 0, 2, 4, 6 of FIGS. 1A-1D, and in which four odd-numbered microelectronic elements 1, 3, 5, and 7 are oriented in the same east-west orientation as the odd-numbered microelectronic elements 1, 3, 5, 7 of FIGS. 1A-1D.

In another example illustrated in FIG. 2, a four chip package 100*a* is provided in which the even-numbered microelectronic elements 0 and 2 are oriented and wire-bonded as they are in FIG. 1A, and in which the odd-numbered microelectronic elements 1 and 3 are oriented and wire-bonded as they are in FIG. 1A.

In a face-down embodiment (not shown) that is a variation of the embodiment shown in FIG. 1A, the element contacts 104 at the front face 105 of each of the microelectronic elements 0 and 1 may be wire bonded to corresponding substrate contacts at a second surface 122 (oppositely-facing relative to the first surface 120) of the support element 102, the wire bonds extending through apertures of the support element 102. In such an embodiment, the front face 105 of the zeroth microelectronic element 0 can be disposed adjacent first surface 120 of the support element 102, the front face 105 of the first microelectronic element 1 can overlie a rear face of the zeroth microelectronic element, and the element contacts 104 can be electrically coupled with terminals 124 at the second surface 122 of the support element through conductive structure (e.g., wire bonds, lead bonds, etc.) aligned with at least one aperture extending between the first and second surfaces of the support element.

Further, in some implementations, stacked chips having through silicon via connections can be provided as an alternative to the wire bond connections shown in FIGS. 1A-1D. In yet another implementation, connections between chips in the stack can be facilitated using packaging structures such as wafer-level packaging or fan-out wafer-level packaging.

In one example, the microelectronic package 100 can have the form of the lower microelectronic package 100*b* of FIG. 10B. Such a microelectronic package can have an encapsulant at least partially covering the microelectronic elements 0-1, 0-3, or 0-7.

Figure 5:
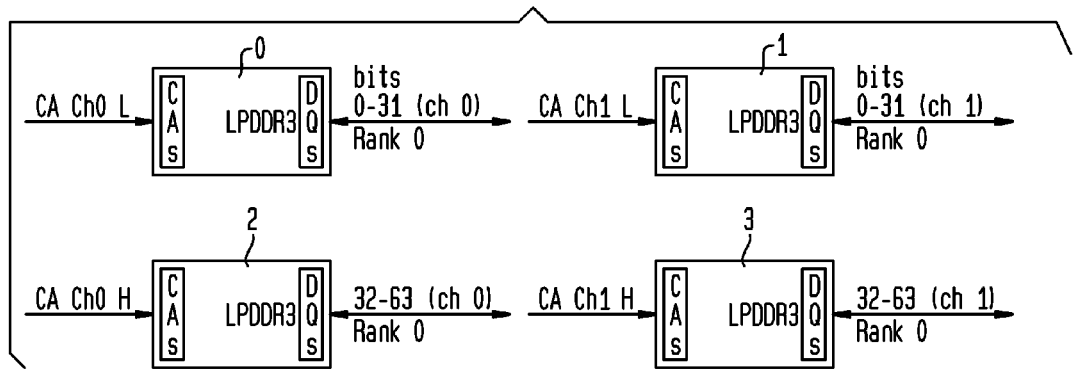
FIG. 5 is a block diagram of a single rank configuration of microelectronic elements that is one potential configuration of the microelectronic package of FIG. 2.
Figure 6:
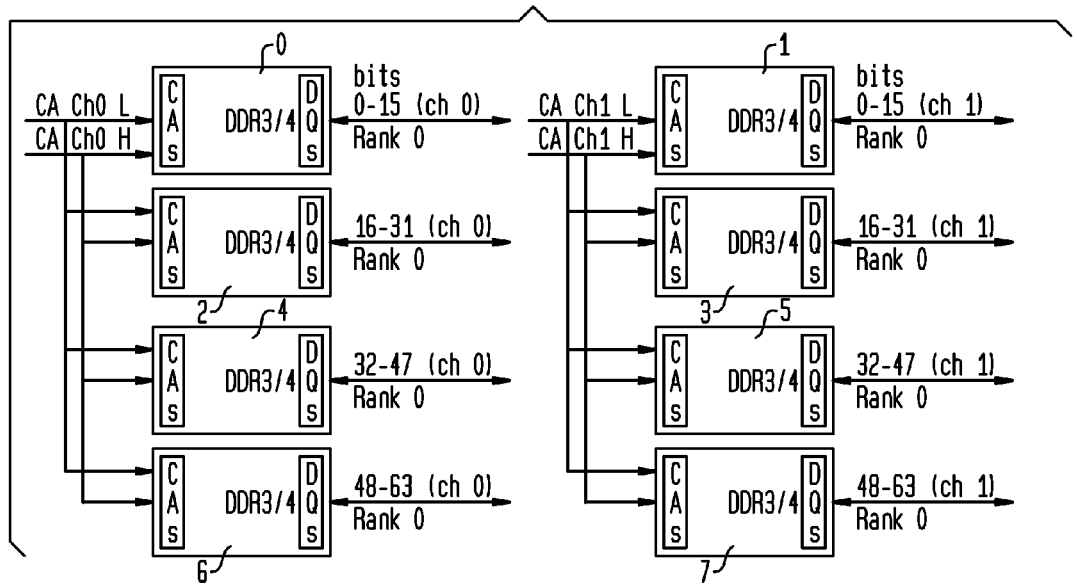
FIG. 6 is a block diagram of a single rank configuration of microelectronic elements that is another potential configuration of the microelectronic package of FIG. 1A.

More examples of the multiple types of memory packages, all of which can be connected to a common terminal ballout as shown in FIG. 3A, are illustrated in FIGS. 4, 5, and 6. For example, an eight microelectronic element LPDDRx microelectronic package is shown in FIG. 4 in which even-numbered microelectronic elements (indicated as "LPDDR3" in FIG. 4) labeled 0, 2, 4, and 6 correspond to those labeled the same in FIGS. 1A-1D, and in which odd-numbered microelectronic elements (indicated as "LPDDR3" in FIG. 4) labeled 1, 3, 5, and 7 correspond to those labeled the same in FIGS. 1A-1D. Dual-channel dual-rank memory access is provided in the eight microelectronic element LPDDRx package shown in FIG. 4.

As further shown, the group of signals CA Ch0 L provides all address input (via element contacts indicated as "CAs" in FIG. 4) to zeroth and fourth microelectronic elements 0 and 4 that is sufficient to specify an addressable memory storage location within the memory storage array of each microelectronic element. The same is true of the group of signals CA Ch0 H which provides all address input (via element contacts indicated as "CAs" in FIG. 4) to second and sixth microelectronic elements 2 and 6 that is sufficient to specify an addressable memory storage location within the memory storage array of each microelectronic element. Likewise, the same applies to CA Ch1 L and first and fifth microelectronic elements 1 and 5 for the first channel (via element contacts indicated as "CAs" in FIG. 4), and the same also applies to CA Ch1 H and third and seventh microelectronic elements 3 and 7 for the first channel (via element contacts indicated as "CAs" in FIG. 4).

The microelectronic elements that are used to support access to rank 0 and rank 1 for each channel are also shown in FIG. 4. Further, in the example shown, it can be seen that zeroth, first, fourth, and fifth microelectronic elements 0, 1, 4, and 5 can be used for read and write access on DQs 0-31 in the respective channels and ranks that are shown in FIG. 4, and that second, third, sixth, and seventh microelectronic elements 2, 3, 6, and 7 can be used for read and write access on DQs 32-63 in the respective channels and ranks that are shown in FIG. 4.

As further seen in FIG. 5, in the four microelectronic element package shown therein, dual-channel single-rank memory access is provided. In the four microelectronic element LPDDRx package shown in FIG. 5, even-numbered microelectronic elements (indicated as "LPDDR3" in FIG. 5) labeled 0 and 2 correspond to those labeled the same in FIG. 2, and odd-numbered microelectronic elements (indicated as "LPDDR3" in FIG. 5) labeled 1 and 3 correspond to those labeled the same in FIG. 2.

Here again, loading of the command address bus is reduced because each microelectronic element 0-3 in the microelectronic package receives (via element contacts indicated as "CAs" in FIG. 5) only the address information on a specific group of the first terminals 125 that need not be shared with any other microelectronic element in the package. Thus, address information on first terminals CA CH0 L is received (via element contacts indicated as "CAs" in FIG. 5) only by the zeroth microelectronic element 0 and no other microelectronic elements in the same microelectronic package, thereby reducing loading onto the signal conductors carrying such signals on a circuit panel to which the microelectronic package 100 is electrically coupled.

FIG. 6 illustrates an eight microelectronic element DDRx microelectronic package arrangement in which the command address bus information received by each microelectronic element (via element contacts indicated as "CAs" in FIG. 6) needs to be provided on both the CA CHx L and CA CHx H first terminals 125 thereto. FIG. 6 further illustrates an example according to current technology in which bit width of the microelectronic elements are limited to 16 bits each, such that four microelectronic elements, i.e., even-numbered microelectronic elements 0, 2, 4, and 6 (indicated as "DDR3/4" in FIG. 6), are required to implement a zeroth memory channel 0, and four odd-numbered microelectronic elements 1, 3, 5 and 7 (indicated as "DDR3/4" in FIG. 6) are required to implement a first memory channel 1. Accordingly, while the eight microelectronic elements DDRx microelectronic package example provides dual-channel memory access, with 16-bit width microelectronic elements, the example shown in FIG. 6 provides only single-rank memory access.

In a variation of the embodiment of FIG. 6, a nine microelectronic element DDRx microelectronic package arrangement may be provided in which bit width of the microelectronic elements are limited to 8 bits each, such that five microelectronic elements, i.e., even-numbered microelectronic elements 0, 2, 4, 6, and 8 are required to implement a 40-bit first portion of a zeroth memory channel 0, and four odd-numbered microelectronic elements 1, 3, 5 and 7 are required to implement a 32-bit second portion of the zeroth memory channel 0. In one example, the eighth microelectronic element 8 can have an ECC memory or error correction code memory function.

Such an arrangement can provide single-channel single-rank 72-bit memory access, and a microelectronic package having such an arrangement of microelectronic elements can be joined to the same arrangement of substrate contacts 106 at the first surface 120 of the support element 102 (FIG. 1D) as the embodiment of FIG. 6, but with some of the substrate contacts connected to no-connect terminals of the microelectronic package. This variation is merely illustrative of a way in which microelectronic elements each having a narrower bit width can be used to make devices of different total bit widths; the particular example used is to be understood as not limiting potential embodiments to those having the particular bit widths described herein.

As used herein, a "no-connect terminal" of a microelectronic package 100, 100*a*, or 100*b* means a terminal that is not connected in any electrical path, e.g., path for conducting information to any microelectronic element, e.g., semiconductor chip, within the microelectronic package, whether or not there is ever any information present on such no-connect terminal. Thus, even if information may be present on a no-connect terminal such as may be coupled thereto from the support structure 170 (FIG. 10A) that is connected to the no-connect terminal, the information present on the no-connect terminal is not in any path to be provided to any microelectronic element within the microelectronic package.

FIG. 7 further illustrates a common arrangement of element contacts 104 at the front face 105 of an LPDDRx-type microelectronic element (e.g., contact pads, indicated as "CAs and DQs" in FIG. 7, provided at the front face of a memory microelectronic element in accordance with LPDDRx, indicated as "LPDDR3" in FIG. 7) that can be used in the microelectronic package 100 of FIG. 1A or the microelectronic package 100*a* of FIG. 2. This arrangement of element contacts 104 shows the address or command/address contacts in a first column 110 or 114 along one edge of the microelectronic element, and the data contacts in a second column 112 or 116 along an opposite edge of the microelectronic element.

Referring to FIG. 8, by contrast, DDRx microelectronic elements (indicated as "DDR3" in FIG. 8) typically have central chip contacts 104*a* (indicated as "Orig pads" in FIG. 8) as originally provided in which the chip contacts extend in one or two rows along or adjacent to a central 'axis' of the microelectronic element. In such case, a redistribution layer (indicated as "RDL" in FIG. 8) can be provided or formed on the chip that redistributes the contacts from the central spine to opposite edges, thereby providing element contacts 104*b* for carrying address information or command/address information in a first column 110 or 114 along one edge of the microelectronic element (indicated as "CAs" in FIG. 8), and element contacts for carrying data signals in a second column 112 or 116 along an opposite edge of the microelectronic element (indicated as "DQs" in FIG. 8).

FIG. 9 further illustrates that for some DDRx chips, particularly DDR4 chips, the redistribution (indicated as "RDL" in FIG. 9) can be made in the manner shown in which the original central chip contacts 104*a* (indicated as "Orig pads" in FIG. 9) are in the middle and the element contacts 104*b* for carrying address information or command/address information in a first column 110 or 114 along one edge of the microelectronic element (indicated as "CAs" in FIG. 9), and the element contacts for carrying data signals in a second column 112 or 116 along an opposite edge of the microelectronic element (indicated as "DQs" in FIG. 9), the first and second columns of element contacts extending along the edges parallel to the central axis of the original central chip contacts as shown.

FIG. 10A is a schematic diagram illustrating a possible interconnection arrangement of the microelectronic package 100 in a microelectronic assembly 150 and its interconnections, indicated as "CAs (ch0)," "CAs (ch1)," "DQs (ch0)," and "DQs (ch1)" in FIG. 10A, with a processor 160 (e.g., a microprocessor), both the microelectronic package and the processor mounted to a support structure 170 such as a circuit panel. In the example shown in FIG. 10A, the microelectronic package 100 and the processor 160 can be mounted to a major surface 171 of the support structure 170. The microelectronic assembly 150 can also have a set of conductors 180 on the support structure 170 configured to carry the address information between the microelectronic package 100 and the processor 160.

The south and west edges 132, 134 of the support element 102 can face toward an edge 161 of the processor 160, and the north and east edges 130, 136 can face away from the edge of the processor, so that the first terminals 125 in the southwest region SW of the second surface of the support element 102 are closer to the edge of the processor than the second terminals 126 in the northeast region NE of the second surface of the support element. In a particular example, the south and west edges 132, 134 of the support element 102 can each be oriented at approximately 45 degrees to the edge 161 of the processor 160. In other embodiments, the microelectronic package 100 and the processor 160 can be oriented in other relative positions that can minimize the length that signals have to travel between the microelectronic package 100 and the processor 160.

As illustrated, the length of the command address bus, indicated as "CAs (ch0)" and "CAs (ch1)" in FIG. 10A, can be reduced in such arrangement because connections to the microelectronic package 100 are made along west and south edges 134, 132 of the support element 102 which are closer to the processor 160. Accordingly, the reduced connection lengths may help facilitate increased speed of signaling along the command address bus between the processor 160 and the microelectronic package 100. Those connections may be short enough so that parallel terminations are not required, thereby saving power.

The connection between the terminals 124 of the microelectronic package 100 and contacts 174 (FIG. 10B) of the support structure 170 can take various forms. The contacts 174 can be coupled to the set of conductors 180 of the support structure 170 and can be joined with corresponding ones of the terminals 124 of the microelectronic package 100 (FIG. 1A) or the microelectronic package 100*a* (FIG. 2). The contacts 174 can have a plurality of predetermined arrangements of address and command information assignments, so that the contacts can be connected with terminals 124 of a microelectronic package 100 or of a microelectronic package 100*a* having microelectronic elements 0-1, 0-3, or 0-7 of various types (e.g., DDRx, GDDRx, LPDDRx, etc.).

The contacts 174 can have address information assignments arranged according to a first predetermined arrangement for connection with a first type of the microelectronic package 100 in which the microelectronic elements 0-1, 0-3, or 0-7 are configured to sample the address information coupled thereto through the contacts at a first sampling rate (e.g., DDR3, DDR4, DDRx). The same contacts 174 can be arranged according to a second predetermined arrangement for connection with a second type of microelectronic package 100 in which the microelectronic elements 0-1, 0-3, or 0-7 are configured to sample the address information coupled thereto through the contacts at a second sampling rate being greater than the first sampling rate (e.g., LPDDR3, LPDDRx).

In a particular embodiment, the microelectronic elements 0-1, 0-3, or 0-7 in the first type of the microelectronic package 100 or 100*a* can be of type DDRx, and the microelectronic elements 0-1, 0-3, or 0-7 in the second type of the microelectronic package can be of type LPDDRx. The contacts 174 that can be arranged according to one predetermined arrangement for connection with two different types of the microelectronic package 100, respectively, are also referred to herein as "co-support contacts."

In one example, the second sampling rate can be an integer multiple of the first sampling rate. For example, the microelectronic assembly 150 can be configured such that if a first type of the microelectronic package 100 or 100*a* having DDR3 or DDR4 memory therein is attached to the support structure 170, the microelectronic elements in the microelectronic package can be configured to sample the address information coupled thereto through the contacts 174 at a first sampling rate, such as once per clock cycle (e.g., on the rising edge of the clock cycle). In this same example, the microelectronic assembly 150 can be configured such that if a second type of the microelectronic assembly 100 or 100*a* having LPDDR3 memory therein is instead attached to the same support structure 170, the microelectronic elements in the microelectronic package can be configured to sample the address information coupled thereto through the contacts 174 at a second sampling rate, such as twice per clock cycle (e.g., once each on the rising edge and falling edge of the clock cycle). Therefore, in this example, the second sampling rate is an integer multiple (2) of the first sampling rate. In these two cases, the support structure 170 can be identical and can function with microelectronic assemblies having either DDRx or LPDDRx memory.

Further variations of the ability of the support structure 170 to be configured to be joined to microelectronic packages having either DDRx or LPDDRx memory therein can be found in the co-owned and co-pending patent application Ser. No. 13/841,052, filed Mar. 15, 2013, which is hereby incorporated by reference herein.

FIG. 10B is a schematic diagram illustrating a possible interconnection arrangement of an upper microelectronic package 100 (FIG. 1A) stacked with a lower microelectronic package 100*b* in a microelectronic assembly 150*a* and its interconnections with a processor 160, both the microelectronic packages and the processor mounted to a support structure 170 such as a circuit panel. In the example shown in FIG. 10B, the lower microelectronic package 100*b* and the processor 160 can be mounted to a major surface 171 of the support structure 170, and the upper microelectronic package 100 can be mounted to the lower microelectronic package. The microelectronic assembly 150*a* can also have a set of conductors (e.g., the set of conductors 180 of FIG. 10A) on the support structure 170 configured to carry the address information between the microelectronic packages and the processor 160.

The lower microelectronic package 100*b* can have terminals 124 (bottom terminals) at the second surface 122 of the support element 102. The lower microelectronic package can have an encapsulant 190 at least partially covering the microelectronic elements 0-1, 0-3, or 0-7. In one example, top terminals 127 at a top surface 191 of the encapsulant can be electrically coupled with the microelectronic elements of the lower microelectronic package via the substrate contacts 106. In other embodiments, the lower microelectronic package 100*b* can have top terminals that are exposed at a surface of the support element 102, or other locations. The terminals 124 of the upper microelectronic package 100 can be joined to the top terminals 127 of the lower microelectronic package 100*b*. In one example, the upper microelectronic package 100 may take the form of the lower microelectronic package 100*b* (with both top and bottom terminals), such that the upper and lower microelectronic packages are identical except for the location of chip select terminals.

In a particular embodiment, the terminals 124 of each of the upper and lower microelectronic packages 100, 100*b* can include second terminals configured to carry second information other than the information carried by the first terminals, the second information including data signals. The support structure 170 of the microelectronic assembly 150*a* can have a set of conductors (e.g., the set of conductors 180 of FIG. 10A) configured to carry 64 bits of the second information between the microelectronic packages 100, 100*b* and the processor 160, where the second terminals of the upper microelectronic package are configured to transfer 32 bits per clock cycle to the set of conductors, and the second terminals of the lower microelectronic package are configured to transfer 32 bits per clock cycle to the set of conductors.

Dual-rank memory access can be provided by stacking the upper and lower microelectronic packages 100 and 100*b*, where each of the second terminals of the upper microelectronic package overlies and is electrically connected with a corresponding one of the second terminals of the lower microelectronic package having the same signal assignment, and each of the second terminals of each of the upper and lower microelectronic packages is electrically connected with each of the microelectronic elements 0-1, 0-3, or 0-7 in each of the upper and lower microelectronic packages.

Dual-width memory access can be provided by stacking the upper and lower microelectronic packages 100 and 100*b*, where each of the second terminals of the upper microelectronic package overlies and is electrically connected with a corresponding no-connect terminal of the lower microelectronic package that is electrically insulated from the microelectronic elements 0-1, 0-3, or 0-7 within the lower microelectronic package, and each of the second terminals of the lower microelectronic package underlies and is electrically connected with a corresponding no-connect terminal of the upper microelectronic package that is electrically insulated from the microelectronic elements 0-1, 0-3, or 0-7 within the upper microelectronic package.

In a variation of FIG. 10B, an upper microelectronic package 100 can be stacked with a lower microelectronic package 100*b* having a processor therein. In such an embodiment, the lower microelectronic package 100*b* can be a system on a chip, for example. Such an embodiment may have a depopulated central region of the terminals 124 at the second surface of the support element of the upper microelectronic package, such that outer terminals 124*a* adjacent the north, south, east, and west edges of the support element are present, while inner terminals 124*b* shown in FIG. 10B are omitted. In one example, such a depopulated central region of a support element can be a central region of the support element disposed between the northeast region NE and the southwest region SW shown in FIG. 3B. In such an embodiment, the processor 160 shown in FIG. 10B can be omitted, since the lower microelectronic package 100*b* can contain a processor.

In this variation, the top terminals 127 of the lower microelectronic package 100*b* can be co-support contacts or co-support terminals arranged according to two different predetermined arrangements for connection with one of two different types of the upper microelectronic package 100, respectively. The microelectronic elements 0-1, 0-3, or 0-7 in a first type of the upper microelectronic package 100 can be of type DDRx and can be configured to sample the address information coupled thereto through the top terminals 127 at a first sampling rate, such as once per clock cycle (e.g., on the rising edge of the clock cycle), and the microelectronic elements 0-1, 0-3, or 0-7 in the second type of the upper microelectronic package can be of type LPDDRx and can be configured to sample the address information coupled thereto through the top terminals 127 at a second sampling rate, such as twice per clock cycle (e.g., once each on the rising edge and falling edge of the clock cycle).

In one embodiment of this variation, the upper microelectronic package 100 can have four microelectronic elements of type LPDDRx therein configured to provide a single-rank memory access as shown in FIG. 5. In a particular embodiment of this variation, the upper microelectronic package 100 can have eight microelectronic elements of type LPDDRx therein configured to provide dual-rank memory access as shown in FIG. 4.

The microelectronic packages and microelectronic assemblies described above with reference to FIGS. 1A through 10B above can be utilized in construction of diverse electronic systems, such as the system 200 shown in FIG. 11. For example, the system 200 in accordance with a further embodiment of the invention includes a plurality of modules or components 206 such as the microelectronic packages or microelectronic assemblies as described above, in conjunction with other electronic components 208, 210 and 211.

In the exemplary system 200 shown, the system can include a circuit panel, motherboard, or riser panel 202 such as a flexible printed circuit board, and the circuit panel can include numerous conductors 204, of which only one is depicted in FIG. 11, interconnecting the modules or components 206, 208, 210 with one another. Such a circuit panel 202 can transport signals to and from each of the microelectronic packages and/or microelectronic assemblies included in the system 200. However, this is merely exemplary; any suitable structure for making electrical connections between the modules or components 206 can be used.

In a particular embodiment, the system 200 can also include a processor such as the semiconductor chip 208, such that each module or component 206 can be configured to transfer a number N of data bits in parallel in a clock cycle, and the processor can be configured to transfer a number M of data bits in parallel in a clock cycle, M being greater than or equal to N.

In the example depicted in FIG. 11, the component 208 is a semiconductor chip and component 210 is a display screen, but any other components can be used in the system 200. Of course, although only two additional components 208 and 211 are depicted in FIG. 11 for clarity of illustration, the system 200 can include any number of such components.

Modules or components 206 and components 208 and 211 can be mounted in a common housing 201, schematically depicted in broken lines, and can be electrically interconnected with one another as necessary to form the desired circuit. The housing 201 is depicted as a portable housing of the type usable, for example, in a cellular telephone or personal digital assistant, and screen 210 can be exposed at the surface of the housing. In embodiments where a structure 206 includes a light-sensitive element such as an imaging chip, a lens 211 or other optical device also can be provided for routing light to the structure. Again, the simplified system shown in FIG. 11 is merely exemplary; other systems, including systems commonly regarded as fixed structures, such as desktop computers, routers and the like can be made using the structures discussed above.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A microelectronic package, comprising:
a support element having first and second oppositely-facing surfaces and a plurality of substrate contacts at the first surface or the second surface, the support element having oppositely-facing north and south edges adjacent to oppositely-facing east and west edges each extending between the north and south edges;
zeroth, first, second, and third stacked microelectronic elements electrically coupled with the substrate contacts, each microelectronic element having a memory storage array having one or more available addressable memory locations; and
terminals at the second surface electrically coupled with the microelectronic elements via the substrate contacts and arranged at locations within a plurality of north and south rows of terminals extending parallel to and adjacent to the north and south edges, respectively, and at locations within a plurality of east and west columns of terminals extending parallel to and adjacent to the east and west edges, respectively,
the terminals including first terminals configured to carry first address information usable by a circuitry within the microelectronic package to determine an addressable memory location from among all the available addressable memory locations of the memory storage arrays of the microelectronic elements, and second terminals configured to carry second information other than the first address information carried by the first terminals, the second information including data signals,
wherein a zeroth subset of the first and second terminals are electrically coupled to the zeroth and second microelectronic elements, the first terminals of the zeroth subset being arranged within a first one of the north and south rows of terminals and the second terminals of the zeroth subset being arranged within a second one of the north and south rows of terminals, and
wherein a first subset of the first and second terminals are electrically coupled to the first and third microelectronic elements, the first terminals of the first subset being arranged within a first one of the east and west columns of terminals and the second terminals of the first subset being arranged within a second one of the east and west columns of terminals.

2. The microelectronic package of claim 1, wherein the north and south rows of terminals each includes no more than four rows of terminals, and the east and west columns of terminals each includes no more than four columns of terminals.

3. The microelectronic package of claim 1, wherein the north and south rows of terminals each extends no more than 2 mm from the north and south edges, respectively, and the east and west columns of terminals each extend no more than 2 mm from the east and west edges, respectively.

4. The microelectronic package of claim 1, wherein the rows of terminals in which the first terminals of the zeroth subset are arranged and the rows of terminals in which the first terminals of the first subset are arranged extend along adjacent ones of the north, east, south, and west edges of the support element.

5. The microelectronic package of claim 4, wherein the second surface has a southwest region encompassing entire lengths of the south and west edges and extending in orthogonal directions from each of the south and west edges one-third of each distance toward the north edge and toward the east edge, respectively, and all of the first terminals of the zeroth and first subsets are arranged within the southwest region of the second surface.

6. The microelectronic package of claim 1, wherein the first terminals are configured to carry all the first address information usable by the circuitry within the microelectronic package to determine an addressable memory location from among all of the available addressable memory locations of the memory storage arrays within the microelectronic package.

7. The microelectronic package of claim 1, wherein the second one of the north and south rows of terminals in which the second terminals of the zeroth subset are arranged and the second one of the east and west columns of terminals in which the second terminals of the first subset are arranged extend along adjacent ones of the north, east, south, and west edges of the support element.

8. The microelectronic package of claim 7, wherein the second surface has a northeast region encompassing entire lengths of the north and east edges and extending in orthogonal directions from each of the north and east edges one-third of each distance toward the south edge and toward the west edge, respectively, and all of the second terminals of the zeroth and first subsets are arranged within the northeast region of the second surface.

9. The microelectronic package of claim 1, wherein the second terminals are configured to carry all data signals to and from the microelectronic package.

10. The microelectronic package of claim 1, wherein each microelectronic element has first and second columns of element contacts extending along a front face thereof adjacent and parallel to first and second opposite edges of the front face, respectively, the first and second edges of the both zeroth and second microelectronic elements being disposed adjacent the south and north edges, respectively, and the first and second edges of both the first and third microelectronic elements being disposed adjacent the west and east edges, respectively.

11. The microelectronic package of claim 10, wherein the first column of element contacts of each of the microelectronic elements is configured to carry all of the first address information usable by the circuitry within the respective microelectronic element to determine an addressable memory location from among all of the available addressable memory locations of the memory storage arrays within the respective microelectronic element.

12. The microelectronic package of claim 1, wherein the zeroth and second microelectronic elements are alternatingly interleaved in a single stacked arrangement with and approximately orthogonal to the first and third microelectronic elements.

13. The microelectronic package of claim 1, wherein the zeroth subset of the second terminals that are electrically coupled to the zeroth and second microelectronic elements comprise a zeroth memory channel, and the first subset of the second terminals that are electrically coupled to the first and third microelectronic elements comprise a first memory channel, and the zeroth and first memory channels are configured to be operated independently from one another.

14. A microelectronic assembly including a support structure and the microelectronic package of claim 1 mounted to a major surface of the support structure, the microelectronic assembly further comprising:
  a microprocessor mounted to the major surface of the support structure; and
  a set of conductors on the support structure configured to carry the first address information between the microelectronic package and the microprocessor.

15. The microelectronic assembly of claim 14, wherein first and second adjacent edges of the north, east, west, and south edges of the support structure having the first terminals of the zeroth and first subsets adjacent thereto face toward an edge of the microprocessor, and third and fourth adjacent edges of the north, east, west, and south edges of the support structure having the second terminals of the zeroth and first subsets adjacent thereto face away from the edge of the microprocessor, so that the first terminals are closer to the edge of the microprocessor than the second terminals.

16. A microelectronic package, comprising:
  a support element having first and second oppositely-facing surfaces and a plurality of substrate contacts at the first surface or the second surface, the support element having oppositely-facing north and south edges adjacent to oppositely-facing east and west edges each extending between the north and south edges;
  zeroth, first, second, and third stacked microelectronic elements electrically coupled with the substrate contacts, each microelectronic element having a memory storage array having one or more available addressable memory locations and first and second columns of element contacts extending along a front face thereof adjacent and parallel to first and second opposite edges of the front face, respectively, the first and second edges of the zeroth microelectronic element adjacent the south and north edges, respectively, and the first and second edges of the first microelectronic element adjacent the west and east edges, respectively; and
  terminals at the second surface electrically coupled with the microelectronic elements via the substrate contacts, the terminals including first terminals configured to carry first address information usable by a circuitry within the microelectronic package to determine an addressable memory location from among all of the available addressable memory locations of the memory storage arrays of the microelectronic elements, and second terminals configured to carry second information other than the first address information carried by the first terminals, the second information including data signals,
  wherein a zeroth subset of the first and second terminals are electrically coupled to the zeroth and second microelectronic elements and a first subset of the first and second terminals are electrically coupled to the first and third microelectronic elements, the zeroth subset of the second terminals comprising a zeroth memory channel and the first subset of the second terminals comprising a first memory channel, and the zeroth and first memory channels are configured to be operated independently from one another.

17. The microelectronic package of claim 16, wherein the zeroth subset of the second terminals are configured to transfer 32 bits twice per clock cycle to each of the zeroth and second microelectronic elements, and the first subset of the second terminals are configured to transfer 32 bits twice per clock cycle to each of the first and third microelectronic elements.

18. The microelectronic package of claim 16, wherein the zeroth and second microelectronic elements are alternatingly interleaved in a single stacked arrangement with and approximately orthogonal to the first and third microelectronic elements.

19. The microelectronic package of claim 16, wherein the second surface has a southwest region encompassing entire lengths of the south and west edges and extending in orthogonal directions from each of the south and west edges one-third of each distance toward the north edge and toward the east edge, respectively, and the first terminals are at the southwest region.

20. The microelectronic package of claim 16, wherein the first terminals are configured to carry all of the first address information usable by the circuitry within the microelectronic package to determine an addressable memory location from among all of the available addressable memory locations of the memory storage arrays within the microelectronic package.

* * * * *